(12) United States Patent
Takenaka et al.

(10) Patent No.: US 12,253,544 B2
(45) Date of Patent: Mar. 18, 2025

(54) CURRENT MEASUREMENT DEVICE

(71) Applicant: Yokogawa Electric Corporation, Tokyo (JP)

(72) Inventors: Kazuma Takenaka, Musashino (JP); Kotaro Ogawa, Musashino (JP); Minako Terao, Musashino (JP); Naoki Noguchi, Musashino (JP)

(73) Assignee: Yokogawa Electric Corporation, Tokyo (JP)

( * ) Notice: Subject to any disclaimer, the term of this patent is extended or adjusted under 35 U.S.C. 154(b) by 115 days.

(21) Appl. No.: 18/016,802

(22) PCT Filed: Jul. 26, 2021

(86) PCT No.: PCT/JP2021/027595
§ 371 (c)(1),
(2) Date: Jan. 18, 2023

(87) PCT Pub. No.: WO2022/030287
PCT Pub. Date: Feb. 10, 2022

(65) Prior Publication Data
US 2023/0273243 A1    Aug. 31, 2023

(30) Foreign Application Priority Data
Aug. 5, 2020 (JP) ................. 2020-133151

(51) Int. Cl.
*G01R 15/18* (2006.01)
*G01R 15/20* (2006.01)

(52) U.S. Cl.
CPC ......... *G01R 15/181* (2013.01); *G01R 15/207* (2013.01)

(58) Field of Classification Search
USPC ............... 324/76.11, 126, 117 H, 117 R
See application file for complete search history.

(56) References Cited

U.S. PATENT DOCUMENTS

2007/0165334 A1    7/2007 Takenaga et al.
2011/0121827 A1*  5/2011 Yakymyshyn ....... G01R 15/207
                                                        324/251
(Continued)

FOREIGN PATENT DOCUMENTS

EP    1037056 A1    9/2000
JP    8-220141 A    8/1996
(Continued)

OTHER PUBLICATIONS

Extended European Search Report (EESR) dated Aug. 13, 2024 issued in European patent application No. 21852263.9.

*Primary Examiner* — Vincent Q Nguyen
(74) *Attorney, Agent, or Firm* — RANKIN, HILL & CLARK LLP

(57) ABSTRACT

A current measurement device (1 to 3) includes a first sensor (SE1) configured to detect a direct current magnetic field and a low-frequency alternating current magnetic field generated by a current (I) flowing through a measurement target conductor (MC), a hollow magnetic shielding member (12) that includes a cutout portion (CP2) into which the measurement target conductor is inserted and in which the first sensor is accommodated, a fixing mechanism (13) configured to fix the measurement target conductor such that a distance between a center of the measurement target conductor inserted into the cutout portion of the magnetic shielding member and the first sensor is a predetermined reference distance (r), and a first calculator (21) configured to calculate a current flowing through the measurement target conductor based on a detection result of the first sensor.

12 Claims, 12 Drawing Sheets

(56) References Cited

U.S. PATENT DOCUMENTS

| | | | |
|---|---|---|---|
| 2011/0202295 A1 | 8/2011 | Tamura et al. | |
| 2017/0336443 A1* | 11/2017 | Yokota | G01R 15/148 |
| 2018/0017656 A1* | 1/2018 | Kato | G01R 15/202 |
| 2018/0120357 A1 | 5/2018 | Takenaka | |
| 2018/0284162 A1 | 10/2018 | Okuyama et al. | |
| 2021/0088557 A1 | 3/2021 | Takenaka et al. | |

FOREIGN PATENT DOCUMENTS

| | | |
|---|---|---|
| JP | 2000-258464 A | 9/2000 |
| JP | 2005-55300 A | 3/2005 |
| JP | 2011-164019 A | 8/2011 |
| JP | 2013-200301 A | 10/2013 |
| JP | 2018-72220 A | 5/2018 |
| JP | 2018-169305 A | 11/2018 |
| JP | 2019-152481 A | 9/2019 |
| WO | 2005/081007 A1 | 9/2005 |
| WO | 2013/176271 A1 | 11/2013 |
| WO | 2017/148823 A1 | 9/2017 |
| WO | 2017/212691 A1 | 12/2017 |

* cited by examiner

CURRENT MEASUREMENT DEVICE

CROSS-REFERENCE TO RELATED APPLICATIONS

This application is a National Phase Application of International Application No. PCT/JP2021/027595, filed Jul. 26, 2021, which claims the priority of Japan Patent Application No. 2020-133151, filed Aug. 5, 2020. The present application claims priority from both applications and each of these applications is herein incorporated in their entirety by reference.

STATEMENT REGARDING FEDERALLY SPONSORED RESEARCH OR DEVELOPMENT

Not Applicable

THE NAMES OF THE PARTIES TO A JOINT RESEARCH AGREEMENT: Not Applicable INCORPORATION-BY-REFERENCE OF MATERIAL SUBMITTED ON A READ-ONLY OPTICAL DISC, AS A TEXT FILE OR AN XML FILE VIA THE PATENT ELECTRONIC SYSTEM Not Applicable

STATEMENT REGARDING PRIOR DISCLOSURES BY THE INVENTOR OR A JOINT INVENTOR

Not Applicable

BACKGROUND OF THE INVENTION

Field of the Invention

The present invention relates to a current measurement device.

Conventionally, various current measurement devices capable of measuring a current flowing through a measurement target conductor in a non-contact manner have been developed. Representative examples of such a current measurement device include, for example, a current transformer (CT) type current measurement device, a current measurement device of a zero-flux method, a current measurement device of a Rogowski method, a Hall element type current measurement device, and the like.

For example, in the current measurement devices of the CT method and the zero-flux method, a magnetic core on which windings are wound is provided around the measurement target conductor, and a current flowing through the wirings (a secondary side) is detected to cancel a magnetic flux generated at the magnetic core by a current flowing through the measurement target conductor (a primary side), and thereby the current flowing through the measurement target conductor is measured. In addition, the current measurement device of the Rogowski method has a Rogowski coil (air core coil) provided around the measurement target conductor, and a magnetic field generated by the alternating current flowing through the measurement target conductor interlinks with the Rogowski coil, and thereby the current flowing through the measurement target conductor is measured by detecting the voltage induced in the Rogowski coil.

Japanese Unexamined Patent Application Publication No. 2005-55300 discloses an example of the current measurement device for the zero-flux method. In addition, Japanese Unexamined Patent Application Publication No. 2011-164019 discloses a current measurement device using a plurality of magnetic sensors. Specifically, in the current measurement device disclosed in Japanese Unexamined Patent Application Publication No. 2011-164019, two magnetic sensors are disposed at different distances from the measurement target conductor, a distance between the magnetic sensors and the measurement target conductor is calculated based on the outputs of these magnetic sensors, and a magnitude of the current flowing through the measurement target conductor is calculated using the calculated distance.

DESCRIPTION OF RELATED ART INCLUDING INFORMATION DISCLOSED UNDER 37 CFR 1.97 AND 1.98

Japanese Unexamined Patent Application Publication No. 2005-55300
Japanese Unexamined Patent Application Publication No. 2011-164019

BRIEF SUMMARY OF THE INVENTION

Technical Problem

Incidentally, when the current flowing through the measurement target conductor is measured, if it is affected by a magnetic field (external magnetic field) other than a magnetic field generated by the current flowing through the measurement target conductor, it is considered that the current measurement accuracy deteriorates. In addition, if the current flowing through the measurement target conductor can be measured in a non-contact manner, it is considered that the current can be measured simply and efficiently. Furthermore, if the device is compact, it is considered that it can be installed in a very small space.

The present invention has been made in view of the circumstances described above, and an object of the present invention is to provide a compact current measurement device capable of measuring a current flowing through a measurement target conductor in a non-contact manner with high accuracy.

Solution to Problem

To solve the problems described above, a current measurement device according to one aspect of the present invention is a current measurement device (1 to 3) that measures a current (I) flowing through a measurement target conductor (MC). The current measurement device includes: a first sensor (SE1) configured to detect a direct current magnetic field and a low-frequency alternating current magnetic field generated by the current flowing through the measurement target conductor; a hollow magnetic shielding member (12) that comprises a cutout portion (CP2) into which the measurement target conductor is inserted and in which the first sensor is accommodated; a fixing mechanism (13) configured to fix the measurement target conductor such that a distance between a center of the measurement target conductor inserted into the cutout portion of the magnetic shielding member and the first sensor is a predetermined reference distance (r); and a first calculator (21) configured to calculate a current flowing through the measurement target conductor based on a detection result of the first sensor.

In addition, the current measurement device according to one aspect of the present invention further includes a sensor head (10, 10A, 10B) that includes the first sensor, the magnetic shielding member, and the fixing mechanism, and a circuit section (20, 20A) that includes the first calculator.

In addition, in the current measurement device according to one aspect of the present invention, the sensor head further comprises a second sensor (SE2, SE3) configured to detect low-frequency to high-frequency alternating current magnetic fields generated by the current flowing through the measurement target conductor. The circuit section further includes: a second calculator (23) configured to calculate the current flowing through the measurement target conductor based on a detection result of the second sensor; and a synthesizer (24) configured to synthesize a calculation result of the first calculator and a calculation result of the second calculator.

In addition, in the current measurement device according to one aspect of the present invention, the second sensor includes a Rogowski sensor (SE2) wound around the measurement target conductor inserted into the cutout portion of the magnetic shielding member.

Alternatively, in the current measurement device according to one aspect of the present invention, the second sensor comprises a coil (SE3) accommodated inside the magnetic shielding member.

Here, in the current measurement device according to one aspect of the present invention, the coil is disposed inside the magnetic shielding member such that a magnetic sensing direction is a tangential direction of the measurement target conductor inserted into the cutout portion.

Moreover, in the current measurement device according to one aspect of the present invention, a beam member (BM) is formed between the cutout portion and the first sensor inside the magnetic shielding member.

Moreover, in the current measurement device according to an aspect of the present invention, the first sensor is disposed inside the magnetic shielding member such that a magnetic sensing direction is a tangential direction of the measurement target conductor inserted into the cutout portion.

Moreover, in the current measurement device according to one aspect of the present invention, a thickness of the magnetic shielding member is set so that magnetic saturation does not occur even if a maximum current that can be measured by the current measurement device flows through the measurement target conductor.

Moreover, in the current measurement device according to one aspect of the present invention, the first calculator is configured to calculate the current flowing through the measurement target conductor by calculating a product of a detection result of the first sensor and a constant uniquely determined based on the reference distance.

In addition, the current measurement device according to one aspect of the present invention further includes an output section configured to output to the outside a measurement result of the current flowing through the measurement target conductor calculated by the first calculator.

Moreover, in the current measurement device according to one aspect of the present invention, the circuit section is separated from the sensor head and connected to the sensor head via a cable.

Furthermore, in the current measurement device according to one aspect of the present invention, the synthesizer includes: a low-pass filter (24$a$) configured to remove high-frequency components from the calculation result of the first calculator, and configured to allow low-frequency components to pass through; a high-pass filter (24$b$) configured to remove low-frequency components from the calculation result of the second calculator, and configured to allow high-frequency components to pass through; a signal level adjuster (24$c$) configured to adjust a level of a signal output from the low-pass filter; and an adder (24$d$) configured to add a signal whose level is adjusted by the signal level adjuster and a signal output from the high-pass filter.

Furthermore, in the current measurement device according to one aspect of the present invention, a thickness of the beam member is set to be equal to or greater than a thickness of the magnetic shielding member such that magnetic saturation does not occur even if a maximum current that can be measured by the current measurement device flows through the measurement target conductor.

Advantageous Effects of Invention

According to the present invention, it is possible to measure a current flowing through the measurement target conductor in a non-contact manner with high accuracy using the compact current measurement device.

DETAILED DESCRIPTION OF THE INVENTION

Figure 1:
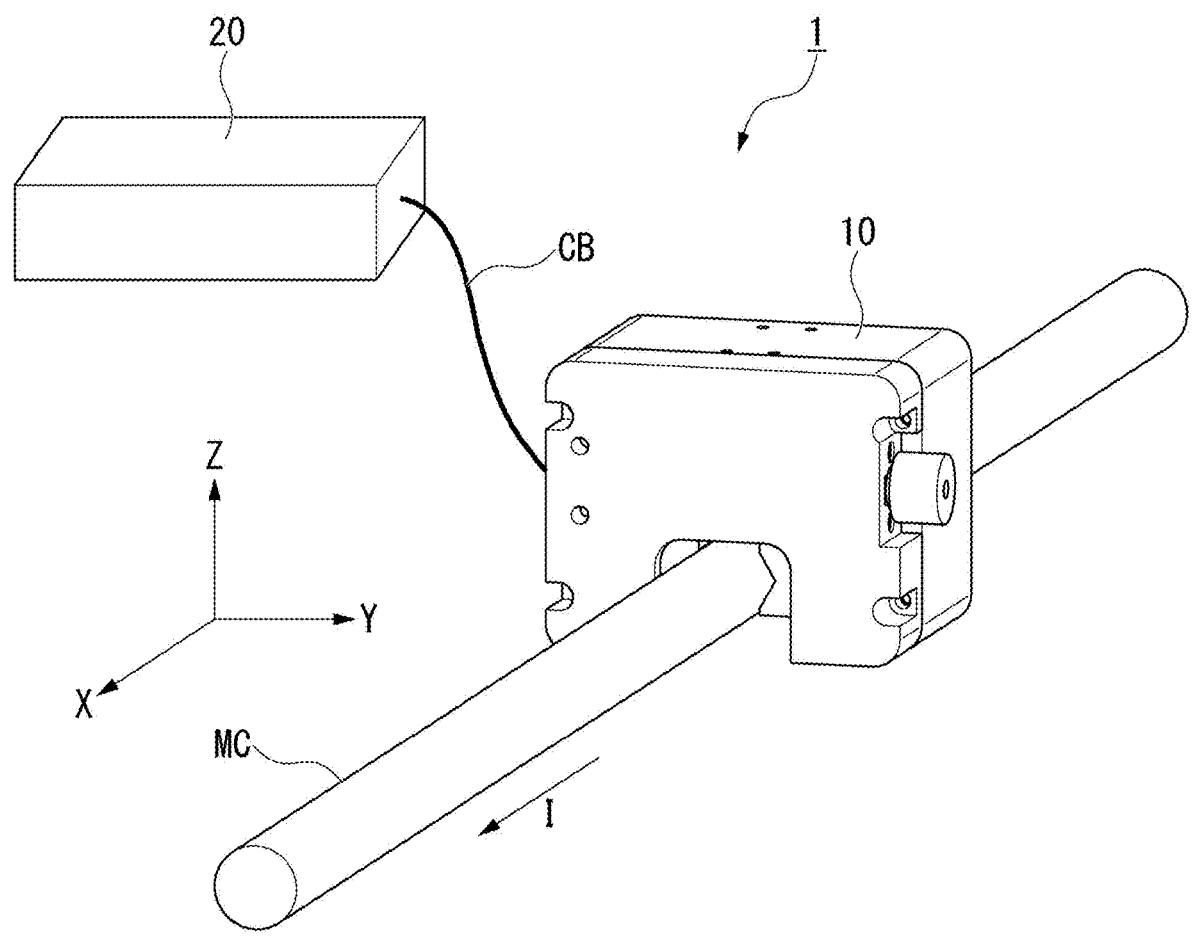
FIG. 1 is an external perspective view of a current measurement device according to a first embodiment of the present invention.

Hereinafter, a current measurement device according to embodiments of the present invention will be described in detail with reference to the drawings. In the following description, an outline of the embodiments of the present invention will be described first, and then details of each embodiment of the present invention will be described.

[Outline]

Embodiments of the present invention make it possible to measure a current flowing through a measurement target conductor using a compact device in a non-contact manner with high accuracy. Specifically, it can be installed in a very small space during current measurement, and direct current and alternating current up to several tens of [MHz] can be measured in a non-contact manner with high accuracy.

In recent years, in a development process of hybrid cars (hybrid vehicles; HVs) and electric vehicles (EVs), there has been a demand to measure large currents flowing between a battery and a power unit, and between a converter and an inverter. Moreover, in recent years, since acceleration in a short period of time has been pursued and an upper limit of current to be used has increased, the wiring tends to be thicker. On the other hand, space-saving, integration, and miniaturization of devices are being promoted to expand passenger space and reduce weight. For this reason, devices and connection wirings are densely packed, and it makes it difficult to secure a space for disposing a current sensor. Under such circumstances, there is a demand for a current measurement device capable of measuring direct current and alternating current flowing in wirings with limited peripheral space in a non-contact manner with high accuracy.

However, in the current measurement device of the zero-flux method disclosed in Japanese Unexamined Patent Application Publication No. 2005-55300 described above, since a magnetic core having a certain size (for example, about 20 [cm] in diameter) needs to be provided around the measurement target conductor, installation in a narrow place is difficult. In addition, since the current measurement device of the Rogowski method described above detects the voltage induced in the Rogowski coil, it cannot measure direct current in principle. In addition, an output signal is weak and the phase is shifted in a low-frequency region, resulting in poor measurement accuracy. Moreover, the current measurement devices disclosed in Japanese Unexamined Patent Application Publication No. 2005-55300 and Japanese Unexamined Patent Application Publication No. 2011-164019 described above are affected by a magnetic field (external magnetic field) other than the magnetic field generated by the current flowing through the measurement target conductor, and therefore have poor measurement accuracy.

In an embodiment of the present invention, a first sensor that detects a direct current magnetic field and a low-frequency alternating current magnetic field generated by a current flowing through a measurement target conductor, a hollow magnetic shielding member that has a cutout portion into which the measurement target conductor is inserted and in which the first sensor is accommodated, a fixing mechanism that fixes the measurement target conductor such that a distance between the measurement target conductor inserted into the cutout portion of the magnetic shielding member and the first sensor is a predetermined reference distance, and a first calculator that calculates a current flowing through the measurement target conductor based on the detection result of the first sensor are provided. As a result, it is possible to measure the current flowing through the measurement target conductor using a compact device in a non-contact manner with high accuracy.

First Embodiment

<Configuration of Current Measurement Device>

FIG. 1 is an external perspective view of a current measurement device according to a first embodiment of the present invention. As shown in FIG. 1, a current measurement device 1 of the present embodiment includes a sensor head 10 and a circuit section 20 connected by a cable CB, and measures a current I flowing through a measurement target conductor MC in a non-contact manner. The measurement target conductor MC is an arbitrary conductor such as a power semiconductor pin or a busbar. To simplify the description below, the measurement target conductor MC is assumed to be a cylindrical conductor.

In the following description, the positional relationships of the members will be described with reference to an XYZ orthogonal coordinate system set in the drawings as necessary. In the XYZ orthogonal coordinate system shown in FIG. 1, an X axis is set in a longitudinal direction of the measurement target conductor MC (a direction of the current I), a Y axis is set in a horizontal direction, and a Z axis is set in a vertical direction. However, for convenience of description, an origin of the XYZ orthogonal coordinate system shown in each drawing is not fixed, but its position is appropriately changed for each drawing.

The sensor head 10 is a member for measuring the current I flowing through the measurement target conductor MC in a non-contact manner. This sensor head 10 is used as, so to speak, a probe for measuring the current I flowing through the measurement target conductor MC in a non-contact manner. It is desirable that the sensor head 10 be decreased in size as much as possible so that the current I can be measured even when space around the measurement target conductor MC is limited.

As shown in FIG. 1, the sensor head 10 is fixedly disposed with respect to the measurement target conductor MC when the current I flowing through the measurement target conductor MC is measured. That is, the sensor head 10 is brought into physical contact with the measurement target conductor MC. However, the sensor head 10 is electrically insulated from the measurement target conductor MC, and the current I flowing through the measurement target conductor MC does not flow into the sensor head 10. For this reason, the sensor head 10 can be used to measure the current I flowing through the measurement target conductor MC in a non-contact manner.

Figure 2:
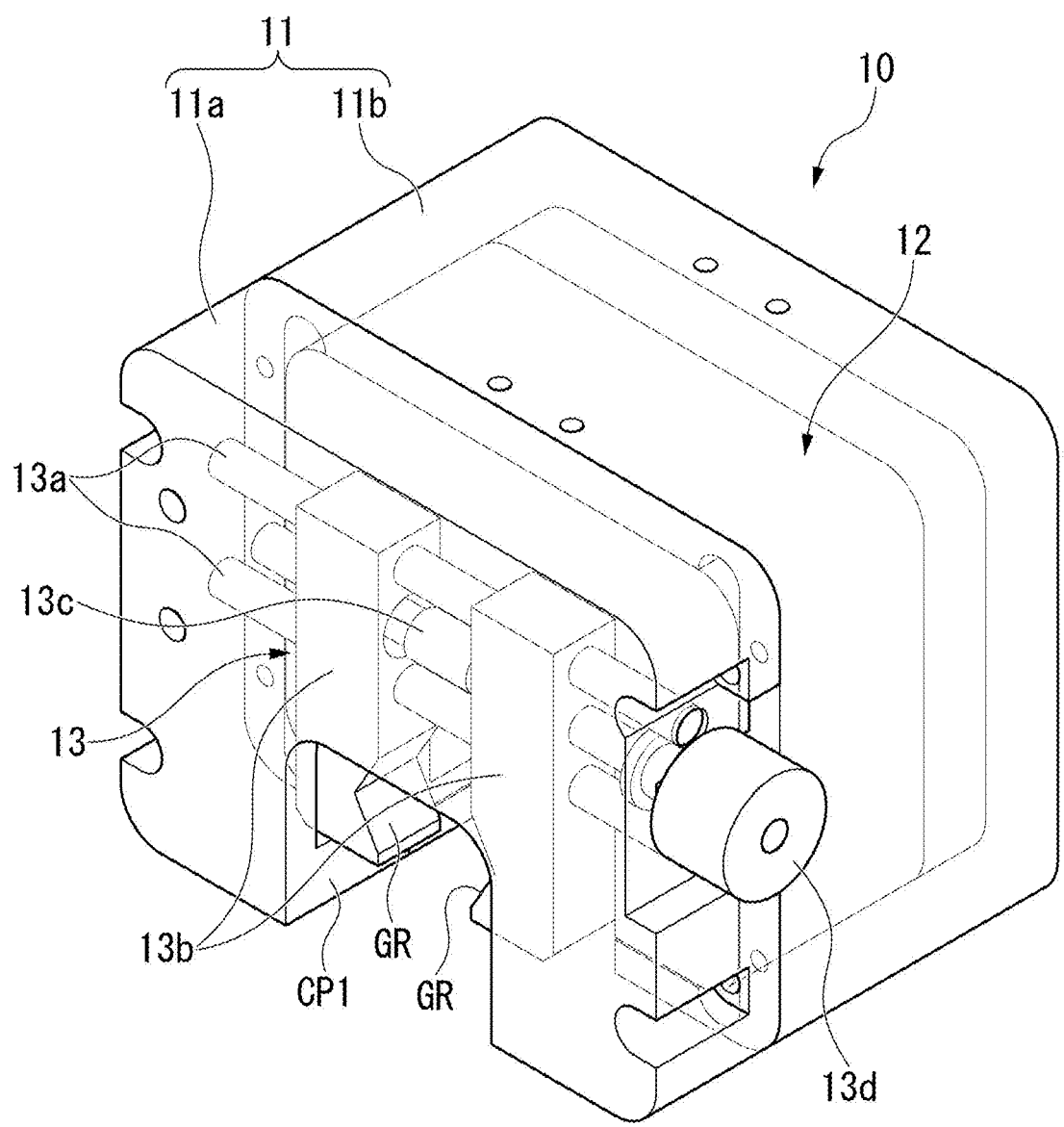
FIG. 2 is a perspective view of a sensor head included in the current measurement device according to the first embodiment of the present invention.
Figure 2:
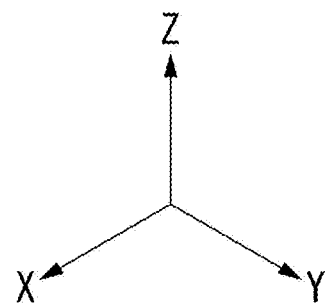

FIG. 2 is a perspective view of the sensor head provided in the current measurement device according to the first embodiment of the present invention. As shown in FIG. 2, the sensor head 10 includes a housing 11, a magnetic shield 12 (magnetic shielding member), and a fixing mechanism 13. The housing 11 is a rectangular parallelepiped hollow member formed by combining a first housing 11a and a second housing 11b and having a cutout portion CP1 formed on a −Z side. The housing 11 (the first housing 11a and the second housing 11b) is formed of a material (for example, a non-magnetic material such as resin) that does not affect a magnetic field generated by the current I. The housing 11 accommodates the magnetic shield 12 and the fixing mechanism 13 therein.

The cutout portion CP1 is formed on the −Z side of the housing 11 to extend from an end of a +X side to an end of a −X side. This cutout portion CP1 is for making it possible to dispose a part of the measurement target conductor MC inside the housing 11. Note that the cutout portion CP1 exemplified in FIG. 2 has a substantially inverted U shape when viewed in an X-axis direction. Since the cutout portion CP1 is formed to extend from the end of the +X side of the housing 11 to the end of the −X side of the housing 11, a part of the measurement target conductor MC can be easily disposed inside the housing 11. That is, the sensor head 10 is disposed with the cutout portion CP1 facing the measurement target conductor MC so that the cutout portion CP1 and the measurement target conductor MC are parallel to each other, and a part of the measurement target conductor MC can be easily disposed inside the housing 11 simply by moving the sensor head 10 toward the measurement target conductor MC.

Figure 3A:
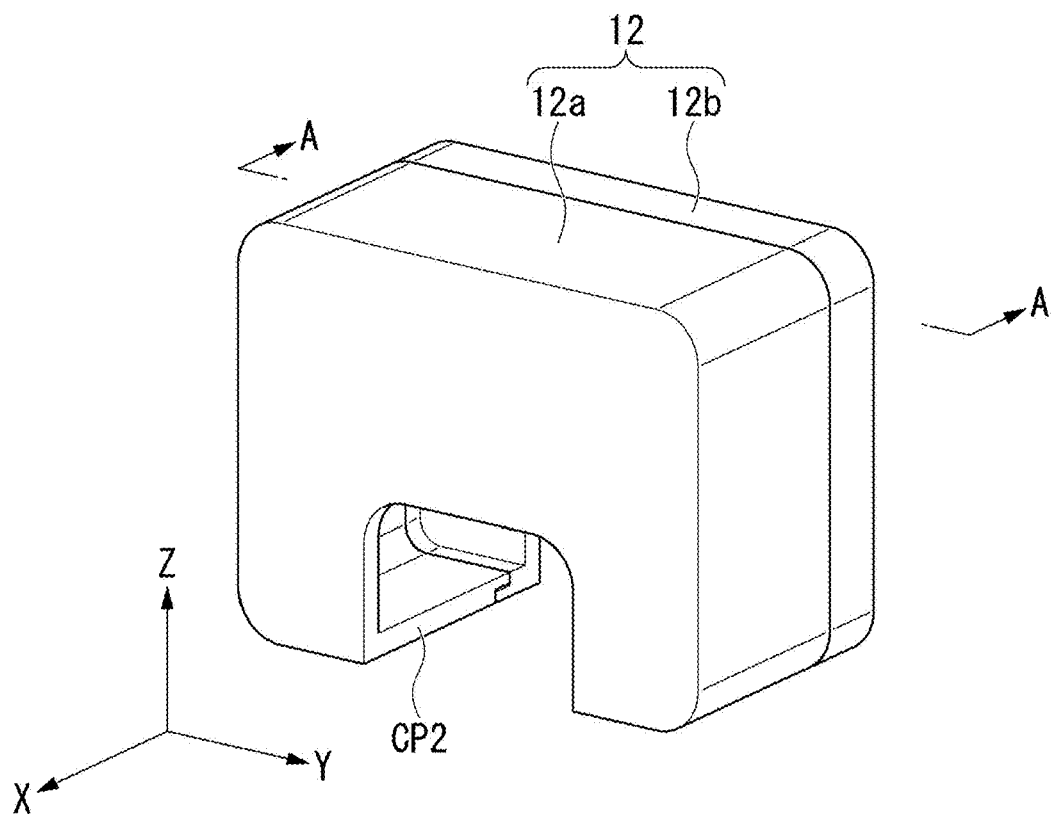
FIG. 3A is a view which shows a magnetic shield included in the current measurement device according to the first embodiment of the present invention.
Figure 3B:
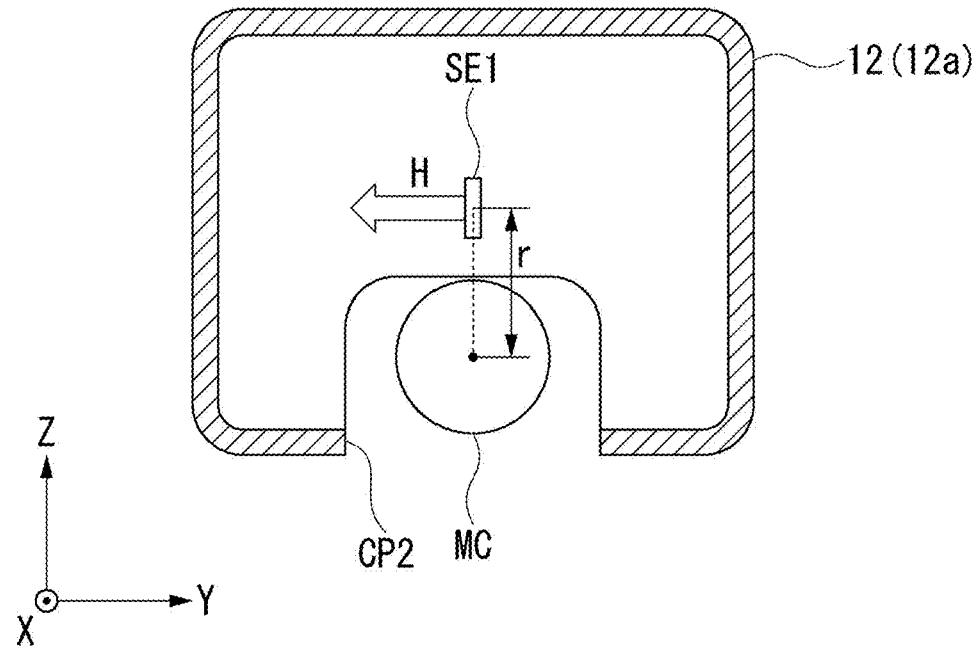
FIG. 3B is a view which shows the magnetic shield included in the current measurement device according to the first embodiment of the present invention.

FIGS. 3A to 3C are views which show a magnetic shield provided by the current measurement device according to the first embodiment of the present invention. FIG. 3A is an external perspective view of the magnetic shield 12, and FIG. 3B is a cross-sectional arrow view along a line A-A in FIG. 3A. As shown in FIG. 3A, the magnetic shield 12 is a rectangular parallelepiped hollow member formed by combining a first shield member 12a and a second shield member 12b and having a cutout portion CP2 on the −Z side. The magnetic shield 12 (the first shield member 12a and the second shield member 12b) is formed of a soft magnetic material (for example, permalloy) having a small holding force and a high magnetic permeability. This magnetic shield 12 is provided to shield magnetic fields (external magnetic fields) other than a magnetic field (a signal magnetic field) generated by the current I flowing through the measurement target conductor MC, and to improve the measurement accuracy of the current 1.

The cutout portion CP2 is formed on the −Z side of the magnetic shield 12 to extend from the end of the +X side to the end of the −X side. This cutout portion CP2 is provided so that a portion of the measurement target conductor MC is disposed inside the magnetic shield 12 when the current I flowing through the measurement target conductor MC is measured. That is, the cutout portion CP2 is provided to dispose a portion of the measurement target conductor MC inside the magnetic shield 12 from which an external magnetic field is shielded. The cutout portion CP2 is set to have the same (or substantially the same) shape and size as the cutout portion CP1 formed in the housing 11 when viewed in the X-axis direction. The magnetic shield 12 is accommodated in the housing 11 such that the cutout portion CP2 overlaps the cutout portion CP1 of the housing 11 when viewed in the X-axis direction.

A thickness of the magnetic shield 12 is set so that magnetic saturation does not occur even if a maximum current that can be measured by the current measurement device 1 (an upper limit current: for example, 1000 [A] in effective value) flows through the measurement target conductor MC. For example, the magnetic shield 12 may be created using a soft magnetic material having a thickness that does not cause the magnetic saturation described above, and may also be created using a laminate having a thickness that does not cause the magnetic saturation described above by stacking a plurality of thin soft magnetic materials. Alternatively, the magnetic shield 12 may be formed by casting, cutting, or the like to have a thickness that does not cause magnetic saturation described above.

The magnetic shield 12 accommodates a magnetic sensor SE1 (a first sensor) therein, as shown in FIG. 3B. A reason for installing the magnetic sensor SE1 in the magnetic shield 12 is to improve the measurement accuracy of the current I by detecting a signal magnetic field in a state where an influence of an external magnetic field is eliminated. The magnetic sensor SE1 detects a direct current magnetic field and an alternating current magnetic field of a low frequency (for example, up to several [kHz]) generated by the current I flowing through the measurement target conductor MC. For example, when the current I flowing through the measurement target conductor MC is a direct current, a magnetic field H shown in FIG. 3B is detected.

The magnetic sensor SE1 is required to have responsiveness because it is used to measure the current I flowing through the measurement target conductor MC. The magnetic sensor SE1 preferably has a delay time of, for example, less than 1 [msec]. The magnetic sensor SE1 may be an analog sensor or a digital sensor as long as the response speed is sufficiently fast. Sensing axes of the magnetic sensor SE1 are desirably three or more, but may also be one or two. When the sensing axes of the magnetic sensor SE1 are two axes or less, the magnetic sensor SE1 is disposed in the magnetic shield 12 such that the sensing axes (a magnetic sensing direction) are a direction of a magnetic field generated by the current I (a tangential direction of the measurement target conductor MC) when the sensor head 10 is fixed to the measurement target conductor MC by the fixing mechanism 13. By disposing the magnetic sensor SE1 in this manner, the influence of the external magnetic field flowing into the magnetic shield 12 from the cutout portion CP2 on the magnetic sensor SE1 can be reduced.

The magnetic sensor SE1 with low noise is used to ensure the measurement accuracy of the current measurement device 1. For example, the magnetic sensor SE1 which has a magnitude of a noise component included in a detection result of the magnetic sensor SE1 being about 0.1% of a measurement range of the current measurement device 1 is used. As the magnetic sensor SE1, for example, a Hall element, a magneto-resistive effect element, or the like can be used.

Figure 4:
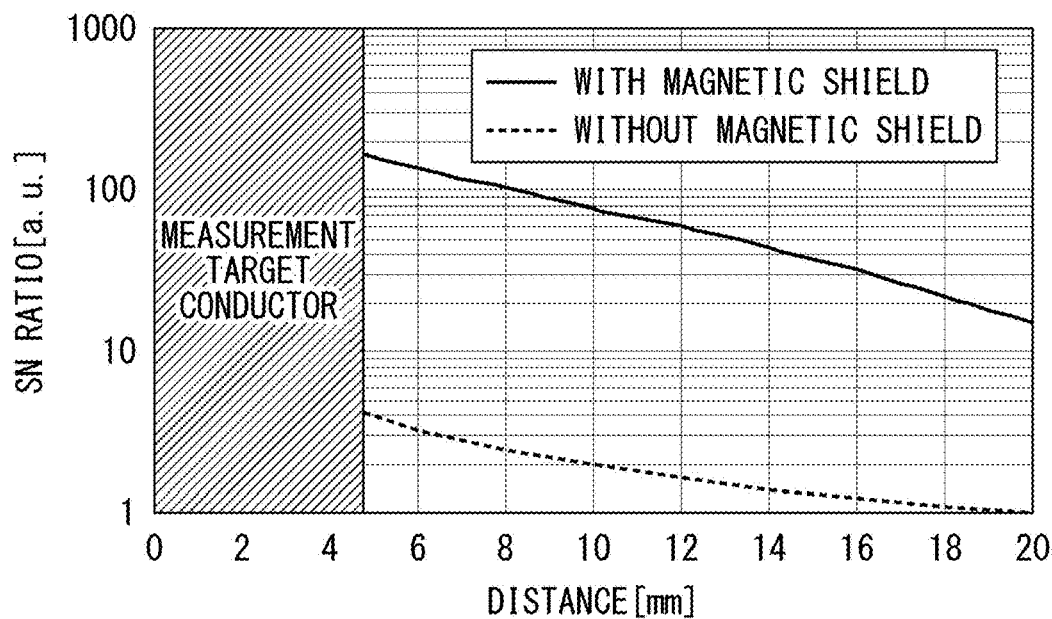
FIG. 4 is a view which shows a simulation result of an SN ratio in the first embodiment of the present invention.

The magnetic sensor SE1 is installed at a position where a strength ratio (an SN ratio (a signal-to-noise ratio)) between the signal magnetic field and the external magnetic field is about 100 to 1 or more in the magnetic shield 12. FIG. 4 is a view which shows simulation results of the SN ratio in the first embodiment of the present invention. In a graph shown in FIG. 4, the horizontal axis represents a distance in a Z direction from a center of the measurement target conductor MC, and the vertical axis represents the SN ratio (logarithm).

In addition, the simulation results shown in FIG. 4 show that there is another conductor through which a current equivalent in magnitude to the current I flowing in the measurement target conductor MC flows adjacent to the measurement target conductor MC, like a three-phase alternating current. In FIG. 4, a graph indicated by a solid line is a simulation result when the magnetic shield 12 is provided, and a graph indicated by a dashed line is a simulation result when the magnetic shield 12 is omitted. In addition, as shown in FIG. 4, in the simulation, a radius of the measurement target conductor MC is set to 5 [mm].

Referring to FIG. 4, it can be known that the SN ratio is much higher when the magnetic shield 12 is provided than when the magnetic shield 12 is omitted. In addition, it can be known that the SN ratio gradually decreases as a distance from the measurement target conductor MC (a distance from the center of the measurement target conductor MC) increases. According to the simulation results shown in FIG. 4, the SN ratio is 100 to 1 or more if the distance from the center of the measurement target conductor MC is within 5 to 8 [mm] The magnetic sensor SE1 is installed, for example, at a position where the distance in the Z direction from the center of the measurement target conductor MC is 8 [mm] in the magnetic shield 12.

The fixing mechanism 13 is a mechanism for fixing the sensor head 10 to the measurement target conductor MC, and is disposed on the +X side of the magnetic shield 12 as shown in FIG. 2. This fixing mechanism 13 fixes the measurement target conductor MC such that a distance between the center of the measurement target conductor MC and the magnetic sensor SE1 becomes a predetermined reference distance r regardless of a diameter of the measurement target conductor MC. For example, the fixing mechanism 13 fixes the measurement target conductor MC such that the distance between the center of the measurement target conductor MC and the magnetic sensor SE1 is 8 [mm].

A reason for setting, by the fixing mechanism 13, the distance of the magnetic sensor SE1 to the measurement target conductor MC to the reference distance r is to calculate the current I by using only the detection result of the magnetic sensor SE1. That is, the current I flowing through the measurement target conductor MC is calculated by multiplying the detection result of the magnetic sensor SE1 by a constant uniquely determined based on the reference distance r. If the distance of the magnetic sensor SE1 to the measurement target conductor MC is set to the reference distance r by the fixing mechanism 13, the current I flowing through the measurement target conductor MC can be calculated using only the measurement result of the magnetic sensor SE1.

The fixing mechanism 13, as shown in FIG. 2, is a guided screw mechanism including a pair of guide members 13a, a pair of fixing arms 13b, left and right screws 13c, and a knob member 13d. Members (the pair of guide members 13a, the pair of fixing arms 13b, the left and right screws 13c, and the knob member 13d) constituting the fixing mechanism 13 are formed of a non-magnetic material such as resin.

The guide member 13a is a cylindrical member for guiding the fixing arm 13b in a Y direction. The pair of guide members 13a are disposed with a certain interval in a Z direction such that the longitudinal direction thereof is along the Y direction. The fixing arm 13b is a quadrangular prism-shaped member having a V-shaped gripping portion GR, a guide hole into which the guide member 13a is inserted, and a screw hole into which the left and right screws 13c are inserted. The pair of fixing arms 13b are disposed so that gripping portions GR face each other, the guide members 13a are inserted into the guide holes, and the left and right screws 13c are screwed into the screw holes.

The left and right screws 13c are, for example, cylindrical screws with a right screw provided on the right side (+Y side) from the center and a left screw provided on the left side (−Y side) from the center. The knob member 13d is a cylindrical member attached to one end (an end on the +Y side) of the left and right screws 13c, and is used to rotate the left and right screws 13c around its axis according to an operation of a user. When the left and right screws 13c rotate in one direction around the axis by operating the knob member 13d, the pair of fixing arms 13b move in the Y direction to be away from each other. On the other hand, when the left and right screws 13c rotate in the other direction around the axis by operating the knob member 13d, the pair of fixing arms 13b move in the Y direction so as to approach each other.

Here, when the measurement target conductor MC is fixed to the sensor head 10, the measurement target conductor MC is sandwiched between the V-shaped gripping portions GR formed on the pair of fixing arms 13b. When the measurement target conductor MC is sandwiched between the gripping portions GR, a position in the Y direction and a position in the Z direction are regulated, and the position in the Y direction and the position in the Z direction of the center of the measurement target conductor MC are the same position regardless of the diameter of the measurement target conductor MC. In this manner, regardless of the diameter of the measurement target conductor MC, the measurement target conductor MC is fixed to the sensor head 10 such that the distance between the center of the measurement target conductor MC and the magnetic sensor SE1 is the predetermined reference distance r.

The circuit section 20 shown in FIG. 1 measures the current I flowing through the measurement target conductor MC on the basis of the detection result output from the sensor head 10 (the detection result of the magnetic sensor SE1). The circuit section 20 outputs or displays a measurement result of the current I to the outside. As the cable CB that connects the sensor head 10 and the circuit section 20, any cable can be used, but it is desirable to have flexibility, to be easy to handle, and to be hard to disconnect.

Figure 5:
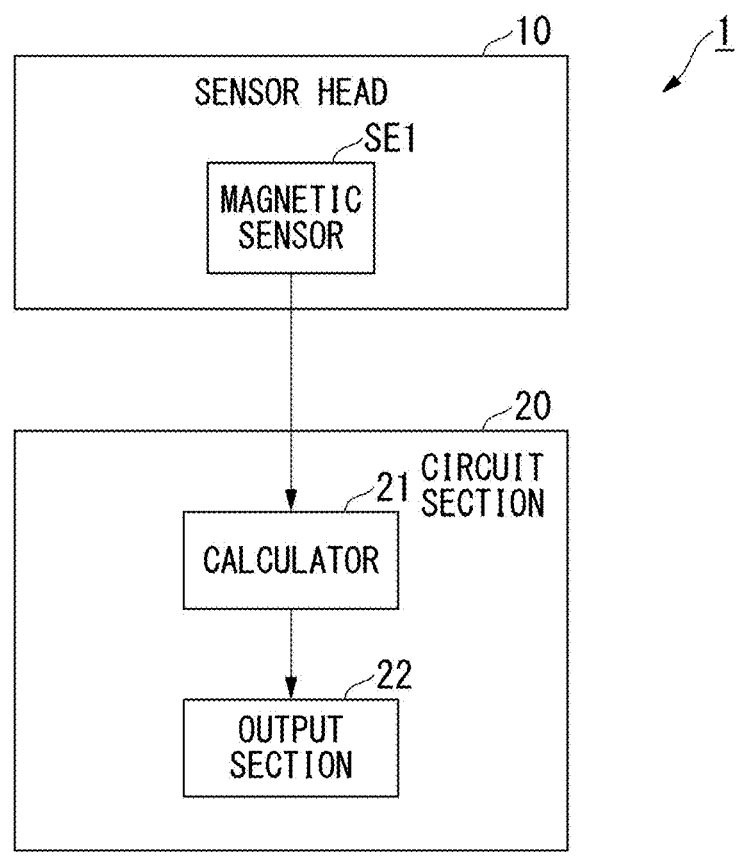
FIG. 5 is a block diagram which shows a configuration of a main part of the current measurement device according to the first embodiment of the present invention.

FIG. 5 is a block diagram which shows a configuration of a main part of the current measurement device according to the first embodiment of the present invention. In FIG. 5, blocks corresponding to the constituents shown in FIG. 1 are denoted by the same reference numerals. In the following description, details of an internal configuration of the circuit section 20 will be mainly described with reference to FIG. 5. As shown in FIG. 2, the circuit section 20 has a calculator 21 (first calculator) and an output section 22.

The calculator 21 calculates the current I flowing through the measurement target conductor MC based on the detection result of the magnetic sensor SE1. Here, since the magnetic sensor SE1 detects the direct current magnetic field and the low-frequency alternating current magnetic field as described above, the current I calculated by the calculator 21 is direct current and low frequency components. Distance information indicating the reference distance r described above is stored in calculator 21 in advance. The calculator 21 calculates the current I flowing through the measurement target conductor MC by calculating a product of the detection result (magnetic field H) of the magnetic sensor SE1 and a constant uniquely determined based on the reference distance r.

The output section 22 outputs the measurement result of the current I calculated by the calculator 21 to the outside. The output section 22 may include, for example, an output terminal for outputting a signal indicating the measurement result of the current I and a display device (for example, a liquid crystal display device) for displaying the measurement result of the current I to the outside.

Here, as shown in FIG. 1, the circuit section 20 is separated from the sensor head 10 and is connected to the sensor head 10 via the cable CB. With such a configuration, a magnetic field detection function (the magnetic sensor SE1) and a calculation function (the calculator 21 and the output section 22) can be separated. As a result, handling of the sensor head 10 becomes easy, and, for example, the sensor head 10 can be easily installed in a narrow space. In addition, various problems (such as temperature characteristics and insulation resistance) and the like that occur when the calculation function is provided in the sensor head 10 can be avoided, and thereby applications of the current measurement device 1 can be expanded.

<Operation of Current Measurement Device>

Next, an operation at the time of measuring the current I flowing through the measurement target conductor MC using the current measurement device 1 will be described. First, a user of the current measurement device 1 performs an operation of fixing the sensor head 10 to the measurement target conductor MC as shown in FIG. 1 to measure the current I flowing through the measurement target conductor MC.

Specifically, the user of the current measurement device 1 disposes the sensor head 10 with the cutout portion CP1 facing the measurement target conductor MC such that the cutout portion CP1 and the measurement target conductor MC are parallel to each other, and moves the sensor head 10 toward the measurement target conductor MC. As a result, a portion of the measurement target conductor MC is disposed inside the housing 11 of the sensor head 10. The user of the current measurement device 1 operates the knob member 13d of the fixing mechanism 13 to move the pair of fixing arms 13b toward each other, and performs work to make the measurement target conductor MC sandwiched by the gripping portions GR of the pair of fixing arms 13b.

When the work is done, the measurement target conductor MC is fixed to the sensor head 10 by the fixing mechanism 13, and the measurement target conductor MC is inserted into the cutout portion CP2 of the magnetic shield 12 provided on the sensor head 10. Note that, in this state, the distance of the magnetic sensor SE1 to the measurement target conductor MC inserted into the cutout portion CP2 of the magnetic shield 12 is set to the reference distance r.

When the work described above is completed, processing of measuring the current I flowing through the measurement target conductor MC is performed. Specifically, first, processing of detecting, by the magnetic sensor SE1, a magnetic field formed by the current I flowing through the measurement target conductor MC is performed. Next, the calculator 21 performs processing of calculating the current I flowing through the measurement target conductor MC based on the detection result of the magnetic sensor SE1. Specifically, the calculator 21 calculates a product of the constant stored therein (a constant uniquely determined based on the reference distance r) and the detection result (the magnetic field H) of the magnetic sensor SE1, thereby performing processing of calculating the current I (direct current and low frequency components) flowing through the measurement target conductor MC. When the processing described above is completed, the output section 22 performs processing of outputting information indicating the current I calculated by the calculator 21. The processing described above is performed continuously or repeatedly at regular intervals (for example, 1 second).

As described above, in the present embodiment, the hollow magnetic shield 12 that has the cutout portion CP2 into which the measurement target conductor MC is inserted, and in which the magnetic sensor SE1 is accommodated, the fixing mechanism 13 that fixes the measurement target conductor MC such that the distance between the center of the measurement target conductor MC and the magnetic shield 12 is the predetermined reference distance r, and the calculator 21 for calculating a current flowing through the measurement target conductor MC based on the detection result of the magnetic sensor SE1 are provided. For this reason, in the present embodiment, the current I (direct current and low-frequency components) flowing through the measurement target conductor MC can be measured using a compact device in a non-contact manner with high accuracy.

Second Embodiment

<Configuration of Current Measurement Device>

Figure 6:
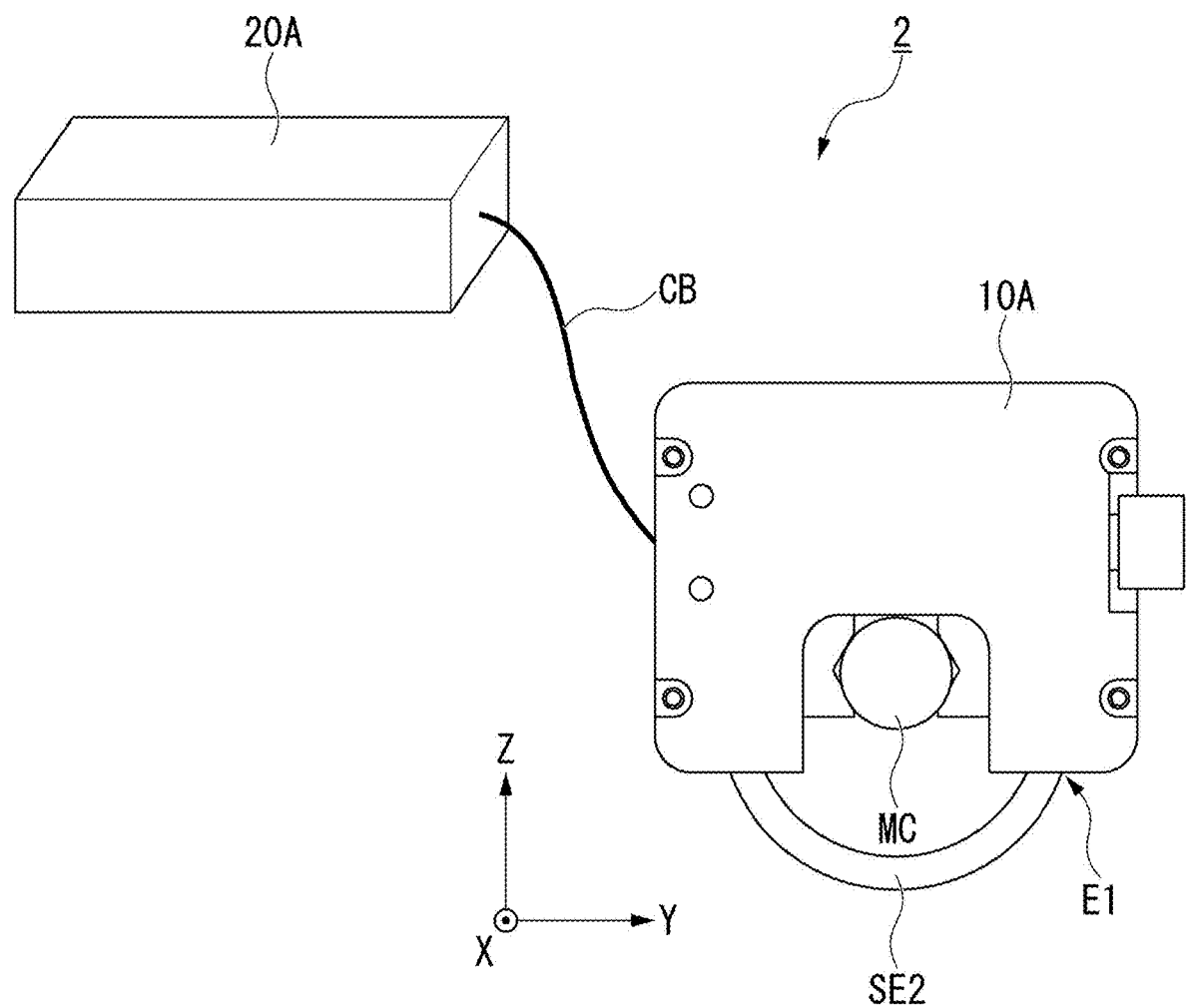
FIG. 6 is an external view of a current measurement device according to a second embodiment of the present invention.

FIG. 6 is an external view of a current measurement device according to a second embodiment of the present invention. As shown in FIG. 6, the current measurement device 2 of the present embodiment includes a sensor head 10A and a circuit section 20A connected by a cable CB, and measures the current I flowing through the measurement target conductor MC in a non-contact manner. The measurement target conductor MC is, for example, an arbitrary conductor such as pins or busbars of a power semiconductor, but for the sake of simplicity of description in the present embodiment, it is assumed that the measurement target conductor MC is a cylindrical conductor.

The sensor head 10A has a configuration in which a Rogowski sensor SE2 (second sensor) is added to the sensor head 10 of the first embodiment. The current measurement device 1 of the first embodiment described above measures the direct current and low frequency components of the current I flowing through the measurement target conductor MC. On the other hand, the current measurement device 2 of the present embodiment is capable of measuring not only direct current and low-frequency components of the current I flowing through the measurement target conductor MC but also low to high frequency components.

The Rogowski sensor SE2 detects an alternating current magnetic field of a low frequency (for example, several [kHz]) to a high frequency (for example, several tens of [MHz]) generated by the current I flowing through the measurement target conductor MC. The Rogowski sensor SE2 is a sensor using a Rogowski coil (air core coil), and is disposed to surround the measurement target conductor MC. The Rogowski sensor SE2 is configured to have one end thereof being detachable from the sensor head 10A to facilitate its disposition around the measurement target conductor MC.

The circuit section 20A measures the current I flowing through the measurement target conductor MC on the basis of the detection results output from the sensor head 10A (the detection results of the magnetic sensor SE1 and the Rogowski sensor SE2). The circuit section 20A outputs or displays the measurement result of the current I to the outside. As in the first embodiment, it is desirable that the cable CB have flexibility, be easy to handle, and be hard to disconnect.

Figure 7:
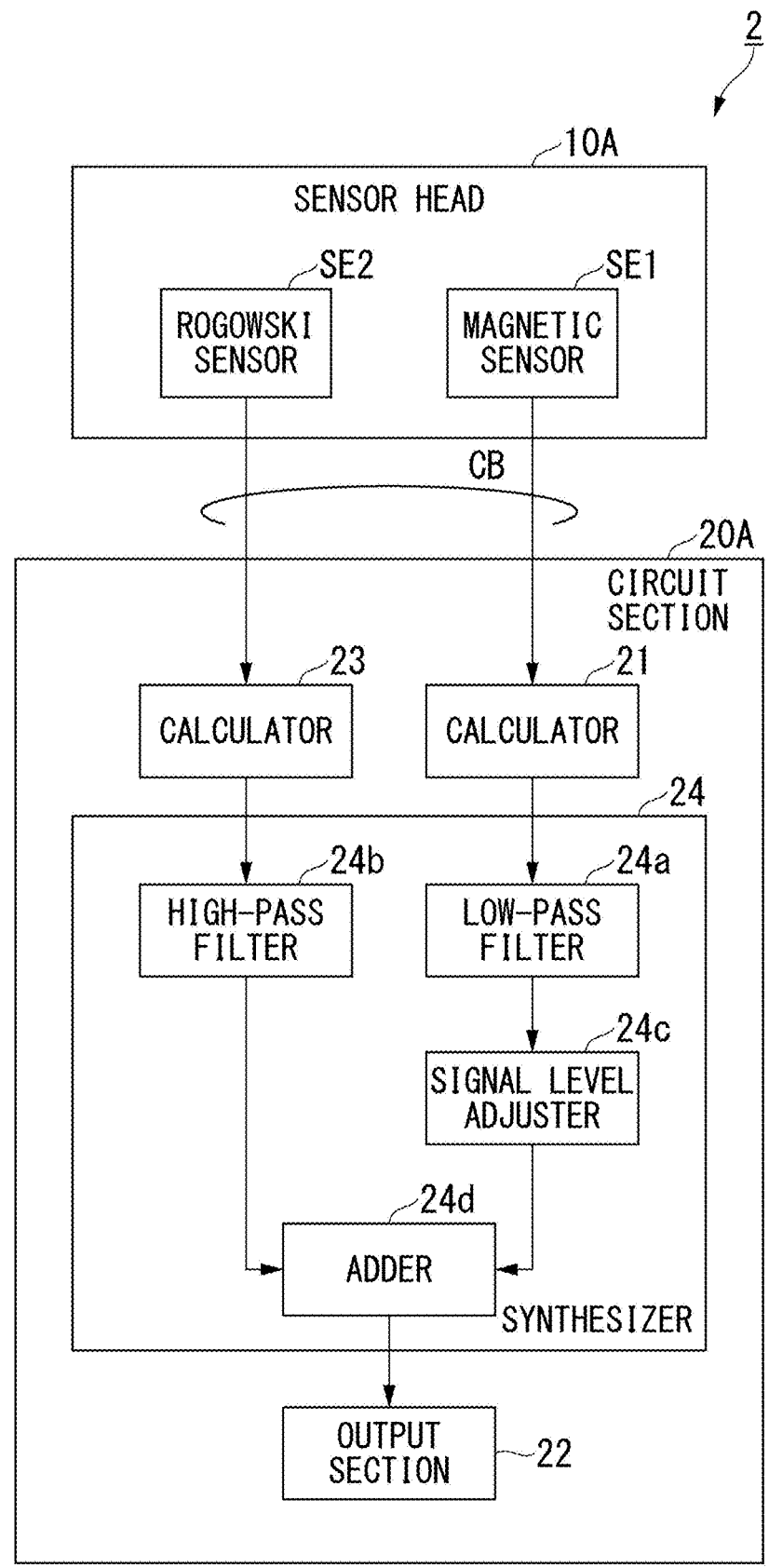
FIG. 7 is a block diagram which shows a configuration of a main part of the current measurement device according to the second embodiment of the present invention.

FIG. 7 is a block diagram which shows a configuration of a main part of the current measurement device according to the second embodiment of the present invention. In FIG. 7, blocks corresponding to constituents shown in FIG. 5 are denoted by the same reference numerals. In the following description, details of an internal configuration of the circuit section 20A will be mainly described with reference to FIG. 7. As shown in FIG. 7, the circuit section 20A has a calculator 23 (a second calculator) and a synthezer 24 in addition to the calculator 21 and the output section 22.

The calculator 23 calculates the current I flowing through the measurement target conductor MC based on the detection result of the Rogowski sensor SE2. Here, since the Rogowski sensor SE2 detects an alternating current magnetic field from a low frequency to a high frequency as described above, the current I calculated by the calculator 23 is low-frequency to high-frequency components. The detection result of the Rogowski sensor SE2 indicates a voltage induced in the Rogowski coil by an alternating current magnetic field generated around the current I (alternating current) flowing through the measurement target conductor MC. The calculator 23 calculates the current I flowing through the measurement target conductor MC by converting the detection result (the voltage) of the Rogowski sensor SE2 into a current value.

The synthesizer 24 synthesizes a calculation result of the calculator 21 and a calculation result of the calculator 23. Specifically, the synthesizer 24 includes a low-pass filter 24a, a high-pass filter 24b, a signal level adjuster 24c, and an adder 24d. The low-pass filter 24a removes high-frequency components from the calculation result of the calculator 21 to cause low-frequency components to pass therethrough, and calculates a signal with desired frequency characteristics suitable for synthesis processing, which will be described below. The high-pass filter 24b removes the low-frequency components from the calculation result of the calculator 23 and allows the high-frequency components to pass through, thereby obtaining a signal with desired frequency characteristics suitable for synthesis processing, which will be described below.

The signal level adjuster 24c adjusts a level of a signal output from the low-pass filter 24a. For example, the signal level adjuster 24c adjusts a signal level of a signal output from the low-pass filter 24a to be the same as a signal level of a signal output from the high-pass filter 24b when a direct current and an alternating current with the same effective value are flowing in the measurement target conductor MC. For example, a variable resistor can be used as the signal level adjuster 24c.

Although the signal level adjuster 24c for adjusting only the level of the signal output from the low-pass filter 24a is included in the present embodiment, the present invention is not limited thereto. For example, a signal level adjuster for adjusting the level of the signal output from the high-pass filter 24b may be provided instead of the signal level adjuster 24c, or may be provided in addition to the signal level adjuster 24c. Alternatively, a signal level adjuster capable of adjusting each of a level of a first signal and a level of a second signal may be provided.

The adder 24d adds a signal whose signal level is adjusted by the signal level adjuster 24c and a signal output from the high-pass filter 24b. The signal whose signal level has been adjusted by the signal level adjuster 24c is a signal representing the direct current and low frequency components of the current I. The signal output from the high-pass filter 24b is a signal indicating the high-frequency component of the current I. For this reason, by adding these, it is possible to calculate a signal indicating a direct current component and an alternating current component to a high frequency.

Figure 8A:
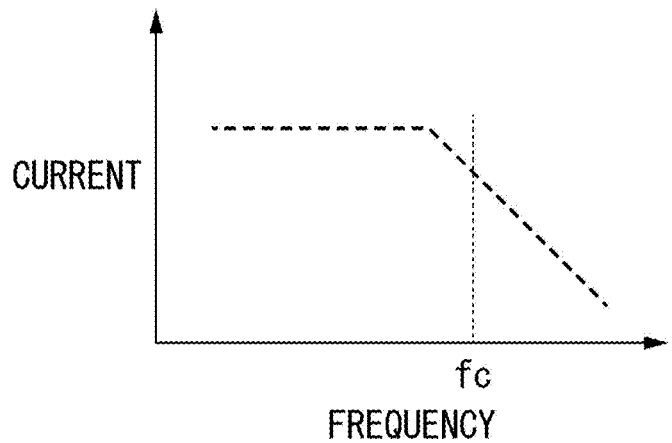
FIG. 8A is a view for describing processing performed by a synthesizer of a circuit section in the second embodiment of the present invention.
Figure 8B:
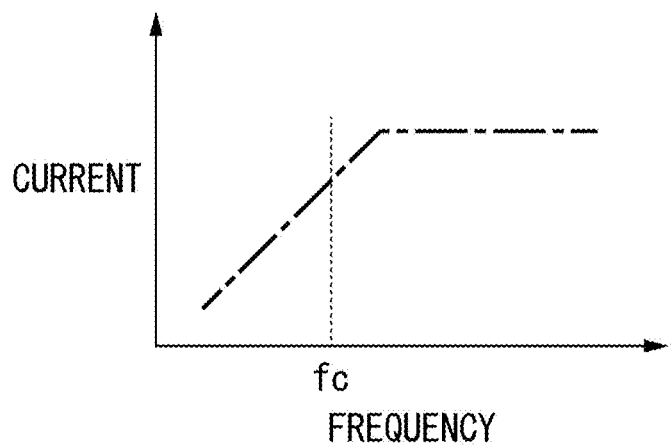
FIG. 8B is a view for describing processing performed by the synthesizer of the circuit section in the second embodiment of the present invention.
Figure 8C:
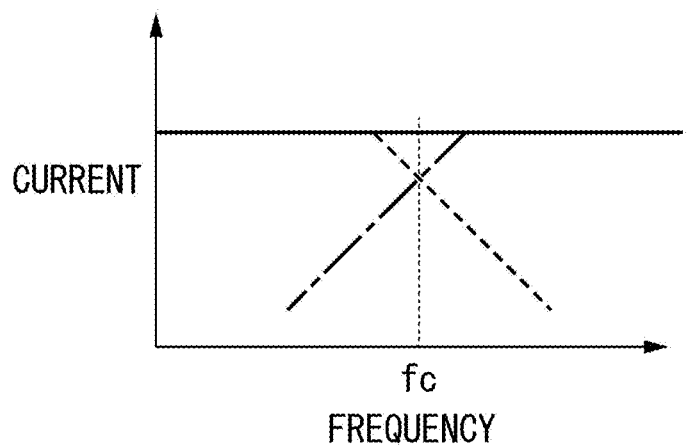
FIG. 8C is a view for describing processing performed by the synthesizer of the circuit section in the second embodiment of the present invention.

FIGS. 8A to 8C are views for describing processing performed by a synthesizer of a circuit section in the second embodiment of the present invention. FIG. 8A is a view which shows an example of filter characteristics of the low-pass filter 24a. FIG. 8B is a view which shows an example of filter characteristics of the high-pass filter 24b. FIG. 8C is a view which shows an example of frequency characteristics of the synthesizer.

As shown in FIGS. 8A and 8B, cutoff frequencies of the low-pass filter 24a and the high-pass filter 24b are both fc. That is, the low-pass filter 24a generally has characteristics of removing components of a frequency higher than the cutoff frequency fc and causing components of a frequency lower than the cutoff frequency fc to pass through. In addition, the high-pass filter 24b generally has characteristics of removing the components of a frequency lower than the cutoff frequency fc and causing the components of a frequency higher than the cutoff frequency fc to pass through.

As shown in FIG. 8C, the frequency characteristics of the synthesizer 24 are characteristics obtained by synthesizing the characteristics shown in FIG. 8A and the characteristics shown in FIG. 8B such that they are flattened at and around the cutoff frequency fc. That is, the frequency characteristics of the synthesizer 24 are characteristics in which an effective value of an alternating current from a low frequency to a high frequency is flattened, and an effective value (current value) of direct current is a value approximately the same as the effective value of alternating current current, which is flattened in this frequency characteristics.

Here, in order for a signal synthesized by the synthesizer 24 (the measurement result of the current I) to become a reproduction of the current I flowing through the measurement target conductor MC, a relationship between a delay time Way of the magnetic sensor SE1 and the cutoff frequency fc needs to satisfy a relationship of $t_{delay} < (1/fc) \times (1/100)$. The delay time $t_{delay}$ described above is time required from when a current flowing through the measurement target conductor MC changes (that is, after the magnetic field applied to the magnetic sensor SE1 changes) to when the magnetic sensor SE1 outputs the detection result.

The output section 22 outputs the signal synthesized by the synthesizer 24 (the measurement result of the current I) to the outside. Note that the output section 22 may include, for example, an output terminal for outputting a signal indicating the measurement result of the current I to the outside, as in the first embodiment, and may also include a display device (for example, a liquid crystal display device) that displays the measurement result of the current I to the outside.

Here, as shown in FIG. 7, the circuit section 20A is separated from the sensor head 10A and connected to the sensor head 10A via the cable CB. With such a configuration, the magnetic field detection function (the magnetic sensor SE1, the Rogowski sensor SE2) and the calculation function (the calculators 21 and 23, the synthesizer 24, and the output section 22) can be separated. As a result, handling of the sensor head 10A becomes easy, and, for example, the sensor head 10A can be easily installed in a narrow place. In addition, various problems (such as temperature characteristics and insulation resistance) and the like that occur when the calculation function is provided in the sensor head 10A can be avoided, and thereby applications of the current measurement device 2 can be expanded.

<Operation of Current Measurement Device>

Next, an operation at the time of measuring the current I flowing through the measurement target conductor MC using the current measurement device 2 will be described. First, the user of the current measurement device 2 performs work to fix the sensor head 10A to the measurement target conductor MC using the fixing mechanism 13 as in the first embodiment to measure the current I flowing through the measurement target conductor MC. When the work described above is performed, the measurement target conductor MC is fixed to the sensor head 10A by the fixing mechanism 13, and the distance of the magnetic sensor SE1 to the measurement target conductor MC is set to reference distance r as in the first embodiment.

In addition, as shown in FIG. 6, the user of the current measurement device 2 performs work to dispose the Rogowski sensor SE2 to surround the measurement target conductor MC. At this time, the user of the current measurement device 2 removes one end E1 of the Rogowski sensor SE2 from the sensor head 10A, if necessary, and performs work to fix the sensor head 10A to the measurement target conductor MC. After the work is completed, the Rogowski sensor SE2 may be disposed in the state described above, and then one end E1 of the Rogowski sensor SE2 may be attached to the sensor head 10A.

When the work above is completed, processing of measuring the current I flowing through the measurement target conductor MC is performed. Specifically, first, processing of detecting, by the magnetic sensor SE1 and the Rogowski sensor SE2, a magnetic field formed by the current I flowing through the measurement target conductor MC is performed. Next, processing of calculating the current I flowing through the measurement target conductor MC based on the detection results of the magnetic sensor SE1 and Rogowski sensor SE2 is performed by the calculators 21 and 23. Specifically, the calculator 21 calculates a product of a constant stored therein (a constant uniquely determined based on the reference distance r) and the detection result (the magnetic field H) of the magnetic sensor SE1, thereby the processing of calculating the current flowing through the measurement target conductor MC (direct current and low frequency components) is performed. In addition, processing of calculating the current I (low-frequency to high-frequency components) flowing through the measurement target conductor MC is performed by the calculator 23 converting the detection result (voltage) of the Rogowski sensor SE2 into a current value.

Subsequently, the synthesizer 24 performs processing of synthesizing currents calculated by the calculators 21 and 23. Specifically, first, a calculation result of the calculator 21 is input to the low-pass filter 24a to remove the high frequency component therefrom, and a calculation result of the calculator 23 is input to the high-pass filter 24b to remove the low frequency component therefrom. Next, processing of adjusting levels of a signal output from the low-pass filter 24a (a low-frequency component having passed through the low-pass filter 24a) and a signal output from the high-pass filter 24b (a high-frequency component having passed through the high-pass filter 24b) is performed by the signal level adjuster 24c.

Then, processing of adding the signal whose signal level has been adjusted by the signal level adjuster 24c and the signal output from the high-pass filter 24b is performed by the adder 24d. In this manner, the currents calculated by the calculators 21 and 23 are synthesized. When the above processing is completed, the current synthesized by the synthesizer 24 is output from the output section 22. The above processing is performed continuously or repeatedly at regular intervals (for example, 1 second).

As described above, in the present embodiment, the magnetic sensor SE1, which is accommodated in the magnetic shield 12 and detects a direct current magnetic field and a low-frequency alternating current magnetic field generated by the current flowing through the measurement target conductor MC, and the Rogowski sensor SE2, which detects low-frequency to high-frequency alternating current magnetic fields generated by the current flowing through the measurement target conductor MC are provided. Then, the current (direct current and low-frequency alternating current) flowing through the measurement target conductor MC is calculated based on the detection result of the Rogowski sensor SE1, the current I flowing through the measurement target conductor MC (from a low frequency to a high frequency) is calculated from the Rogowski sensor SE2, and each of the calculation results are synthesized. For this reason, in this embodiment, the current I (direct current and low-frequency components and low-frequency to high-frequency components) flowing through the measurement target conductor MC can be measured using a compact device in a non-contact manner with high accuracy.

Third Embodiment

<Configuration of Current Measurement Device>

Figure 9:
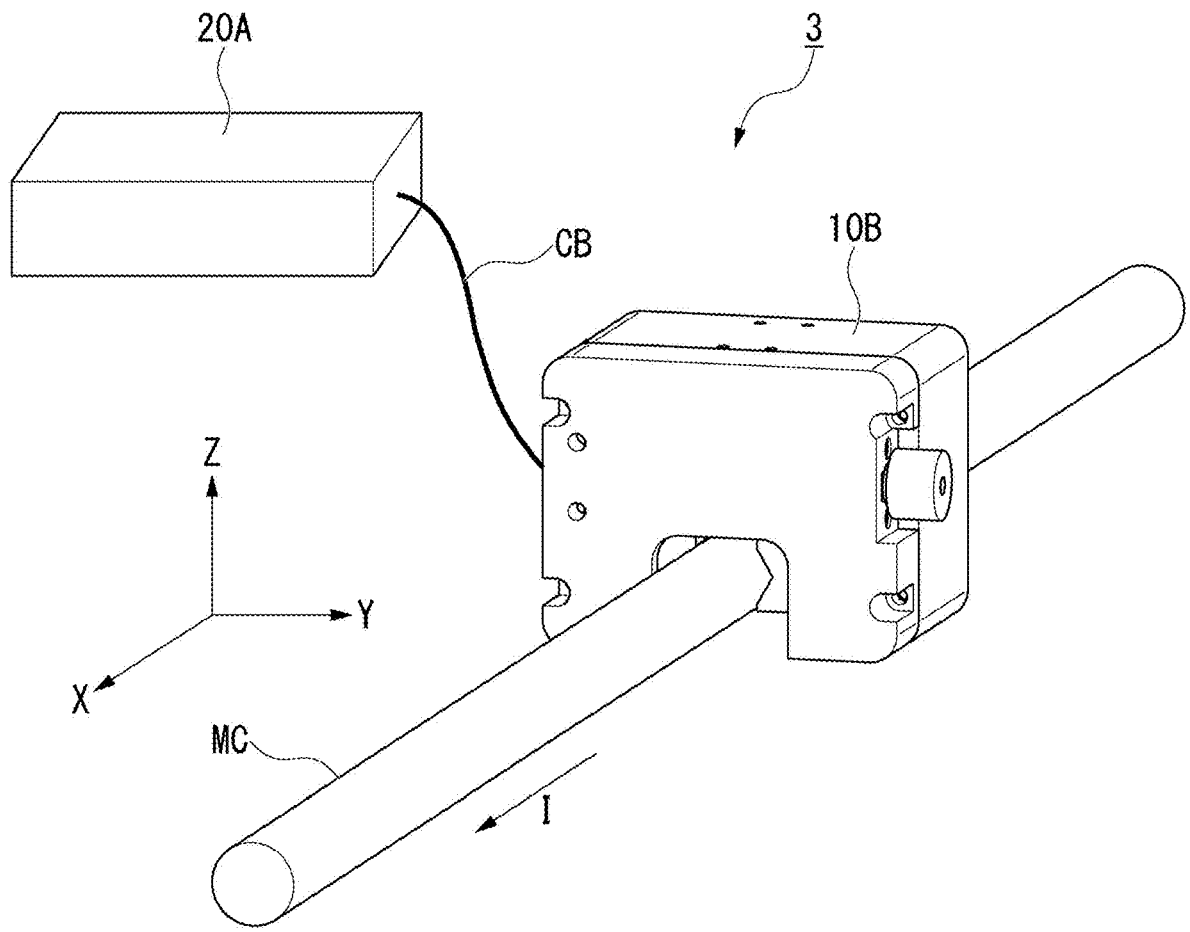
FIG. 9 is an external view of a current measurement device according to a third embodiment of the present invention.

FIG. 9 is an external view of a current measurement device according to a third embodiment of the invention. As shown in FIG. 9, a current measurement device 3 of the present embodiment has a configuration in which the sensor head 10A included in the current measurement device 2 shown in FIG. 6 is replaced with a sensor head 10B. Like the current measurement device 2 of the second embodiment, the current measurement device 3 of the present embodiment can measure low to high frequency components in addition to the direct current and low frequency components of the current I flowing through the measurement target conductor MC.

Figure 10:
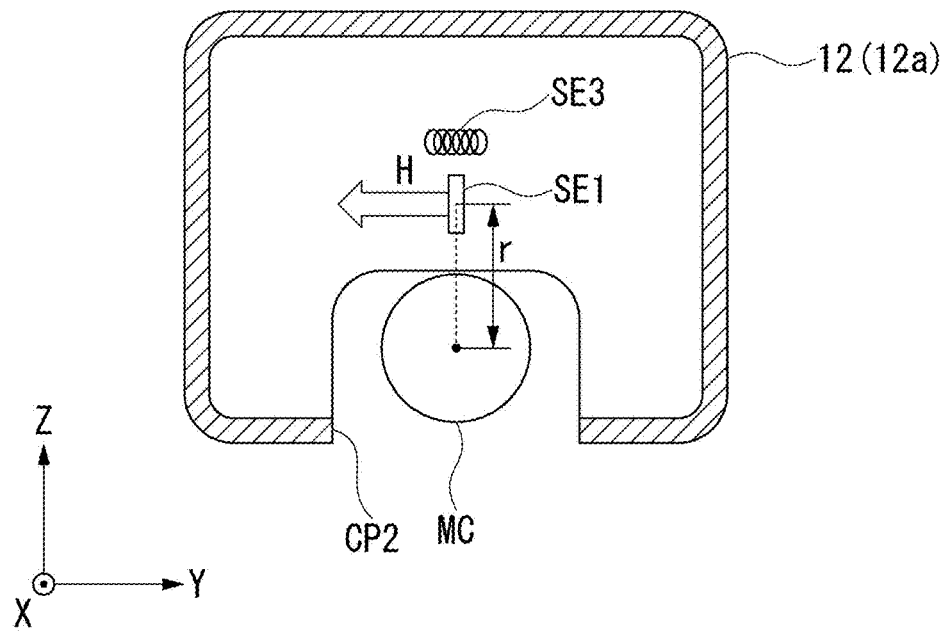
FIG. 10 is a cross-sectional arrow view of a magnetic shield of a sensor head included in the current measurement device according to the third embodiment of the present invention.

FIG. 10 is a cross-sectional arrow view of a magnetic shield of a sensor head provided in the current measurement device according to the third embodiment of the present invention. FIG. 10 corresponds to the cross-sectional arrow view shown in FIG. 3B. The sensor head 10B has a configuration in which the Rogowski sensor SE2 of the sensor head 10A of the second embodiment is omitted, and a coil SE3 (a second sensor) is provided instead.

Like the Rogowski sensor SE2, the coil SE3 detects an alternating current magnetic field from a low frequency (for example, several [kHz]) to a high frequency (for example, several tens of [MHz]) generated by the current I flowing in measurement target conductor MC. The coil SE3 is designed according to the maximum current (an upper limit current) which can be measured by the current measurement device 3 and the maximum frequency which can be measured by the current measurement device 3, and is accommodated in the magnetic shield 12 as shown in FIG. 10.

Specifically, the coil SE3 is disposed in the magnetic shield 12 such that a sensing axis (a magnetic sensing direction) is in a direction of a magnetic field generated by the current I (a tangential direction of the measurement target conductor MC) when the sensor head 10B is fixed to the measurement target conductor MC by the fixing mechanism 13. By disposing the coil SE3 in this manner, the influence of an external magnetic field flowing into the magnetic shield 12 from the cutout portion CP2 on the coil SE3 can be reduced. In an example shown in FIG. 10, the coil SE3 is disposed at a position in which a distance from the center of the measurement target conductor MC inside the magnetic shield 12 becomes longer than a distance between the magnetic sensor SE1 and the center of the measurement target conductor MC. The position of the coil SE3 inside the sensor head 10B is not limited to the position exemplified in FIG. 10, and may be provided at a position different from the position exemplified in FIG. 10.

The circuit section 20A has the same configuration as the circuit section 20A provided in the current measurement device 2 according to the second embodiment. In a circuit configuration of the current measurement device 3 of the present embodiment, the Rogowski sensor SE2 shown in FIG. 7 can be read as the coil SE3, and the sensor head 10A can be read as the sensor head 10B. As in the first and second embodiments, the cable CB desirably has flexibility, is desirably easy to handle, and is desirably hard to disconnect.

<Operation of Current Measurement Device>

The operation of the current measurement device 3 of the present embodiment is basically the same as the operation of the current measurement device 2 of the second embodiment, so detailed description will be omitted. In the present embodiment, since the Rogowski sensor SE2 provided in the current measurement device 2 of the second embodiment is omitted, work to dispose the Rogowski sensor SE2 (work to dispose the Rogowski sensor SE2 to surround the measurement target conductor MC) performed in the second embodiment will be omitted.

As described above, in the present embodiment, the magnetic sensor SE1 for detecting the direct current magnetic field and the low-frequency alternating current magnetic field generated by the current flowing through the measurement target conductor MC and the coil SE3 for detecting the low frequency to high frequency alternating current magnetic fields generated by the current flowing through the measurement target conductor MC are accommodated in the magnetic shield 12. Then, the current (direct current and low-frequency alternating current) flowing through the measurement target conductor MC is calculated based on the detection result of the magnetic sensor SE1, and the current (a low frequency to a high frequency) flowing through the measurement target conductor MC is calculated based on the detection result of the coil SE3 to synthesize each calculation result. For this reason, in the present embodiment, the current I (direct current and low-frequency components, and low-frequency to high-frequency components) flowing through the measurement target conductor MC can be measured using a compact device in a non-contact manner with high accuracy.

Moreover, in the present embodiment, instead of the Rogowski sensor SE2 provided in the current measurement device 2 of the second embodiment, the coil SE3 accommodated in the magnetic shield 12 is provided. For this reason, it is possible to omit work to dispose the Rogowski sensor SE2 (work to dispose the Rogowski sensor SE2 to surround the measurement target conductor MC), which is necessary in the second embodiment, and to further decrease the sensor head in size.

Fourth Embodiment

A current measurement device according to a fourth embodiment of the present invention includes a beam member BM inside the magnetic shield 12 of the sensor heads 10, 10A, and 10B provided in the current measurement devices 1 to 3 according to the first to third embodiments described above. Such a current measurement device improves an SN ratio within the magnetic shield 12 to improve the measurement accuracy. In the followings, an example in which the beam member BM is provided inside the magnetic shield 12 of the sensor head 10 of the current measurement device 1 according to the first embodiment will be described.

Figure 11A:
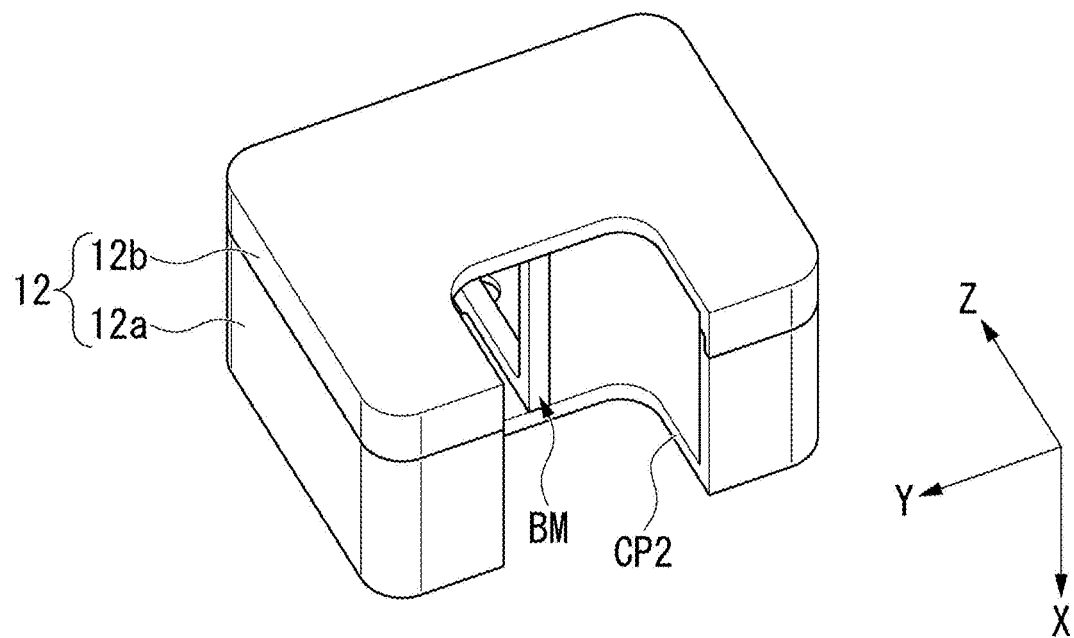
FIG. 11A is a view which shows a configuration of the magnetic shield provided in a sensor head of a current measurement device according to a fourth embodiment of the present invention.
Figure 11B:
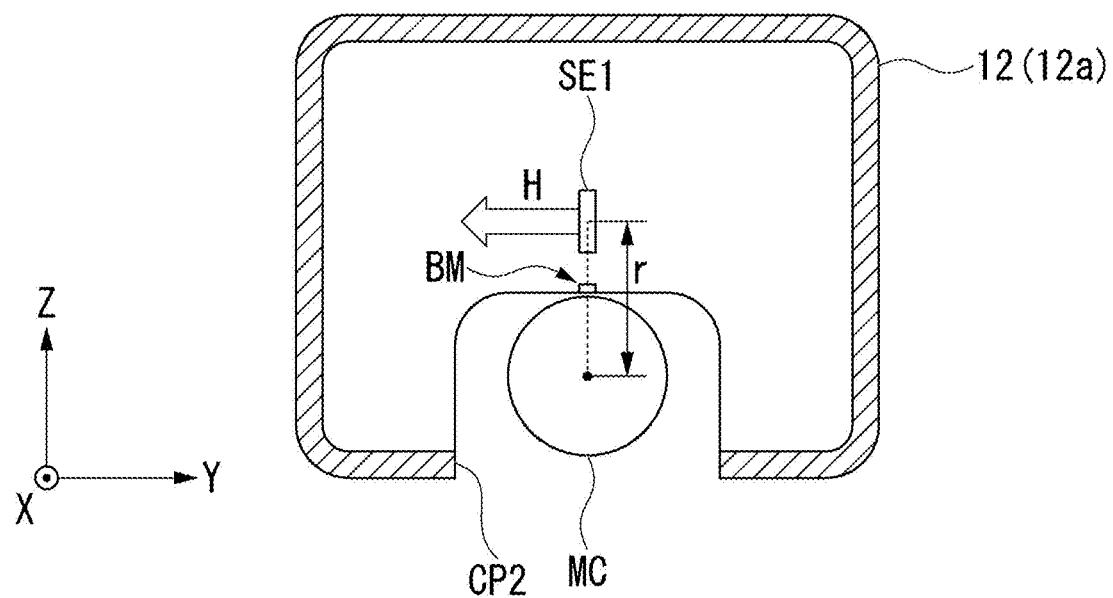
FIG. 11B is a view which shows a configuration of a magnetic shield provided in the sensor head of the current measurement device according to the fourth embodiment of the present invention.
Figure 11C:
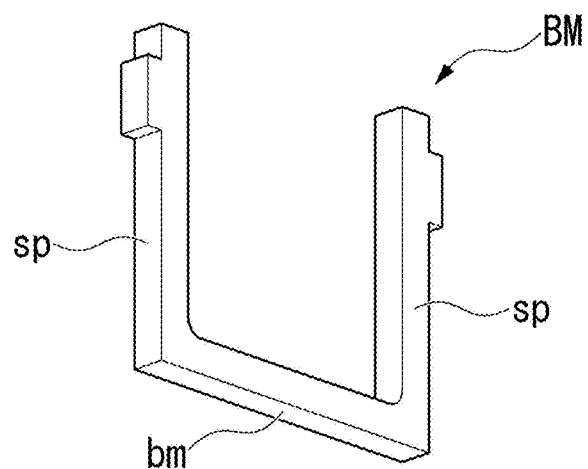
FIG. 11C is a view which shows the configuration of the magnetic shield provided in the sensor head of the current measurement device according to the fourth embodiment of the present invention.
Figure 11D:
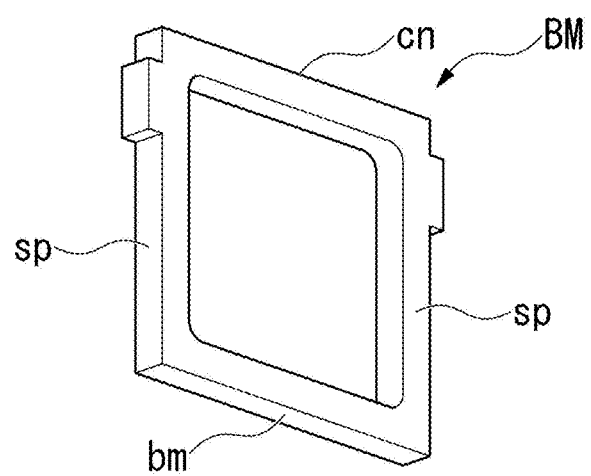
FIG. 11D is a view which shows the configuration of the magnetic shield provided in the sensor head of the current measurement device according to the fourth embodiment of the present invention.

FIGS. 11A to 11D are views which show a configuration of a magnetic shield provided in the sensor head of the current measurement device according to the fourth embodiment of the present invention. FIG. 11A is an external perspective view of the magnetic shield 12, FIG. 11B is a cross-sectional arrow view of the magnetic shield 12, and FIGS. 11C and 11D are perspective views which exemplify the beam member BM provided inside the magnetic shield 12. Note that FIG. 11B corresponds to the cross-sectional arrow view shown in FIG. 3B.

The beam member BM is, for example, formed of the same material as the magnetic shield 12 (for example, permalloy, or the like). A thickness of the beam member BM is set to be equal to or greater than a thickness of the magnetic shield 12 such that magnetic saturation does not occur even if the maximum current (upper limit current) that can be measured by the current measurement device 1 flows through the measurement target conductor MC. Incidentally, the beam member BM may be produced by the same manufacturing method as the magnetic shield 12.

In addition, the beam member BM may be formed integrally with the magnetic shield 12 or may be formed separately from the magnetic shield 12. When the beam member BM is formed separately from the magnetic shield 12, for example, the beam member BM shown in FIG. 11C or 11D can be used. The beam member BM shown in FIG. 11C is a member composed of a quadrangular prism-shaped beam bin and a pair of columnar support portions sp provided at both ends of the beam bm. The beam member BM shown in FIG. 11D is a member composed of the quadrangular prism-shaped beam bm, the pair of columnar support portions sp provided at both ends of the beam bm, and a connecting portion cn for connecting the other ends of the support portions sp.

The beam member BM is disposed in the magnetic shield 12 such that, for example, the quadrangular prism-shaped beam bm extends in the X direction on the −Z side of the magnetic sensor SE1 (between the magnetic sensor SE1 and the cutout portion CP2). At this time, in the beam member BM, both ends (the pair of columnar support portions sp) of the beam bm are in contact with inner walls of the first shield member 12a and the second shield member 12b, respectively. Note that the beam member BM does not necessarily have to be disposed so that the beam bm extends in the X direction. For example, the beam member BM may also be disposed such that the beam bin extends in the Y direction.

Figure 12A:
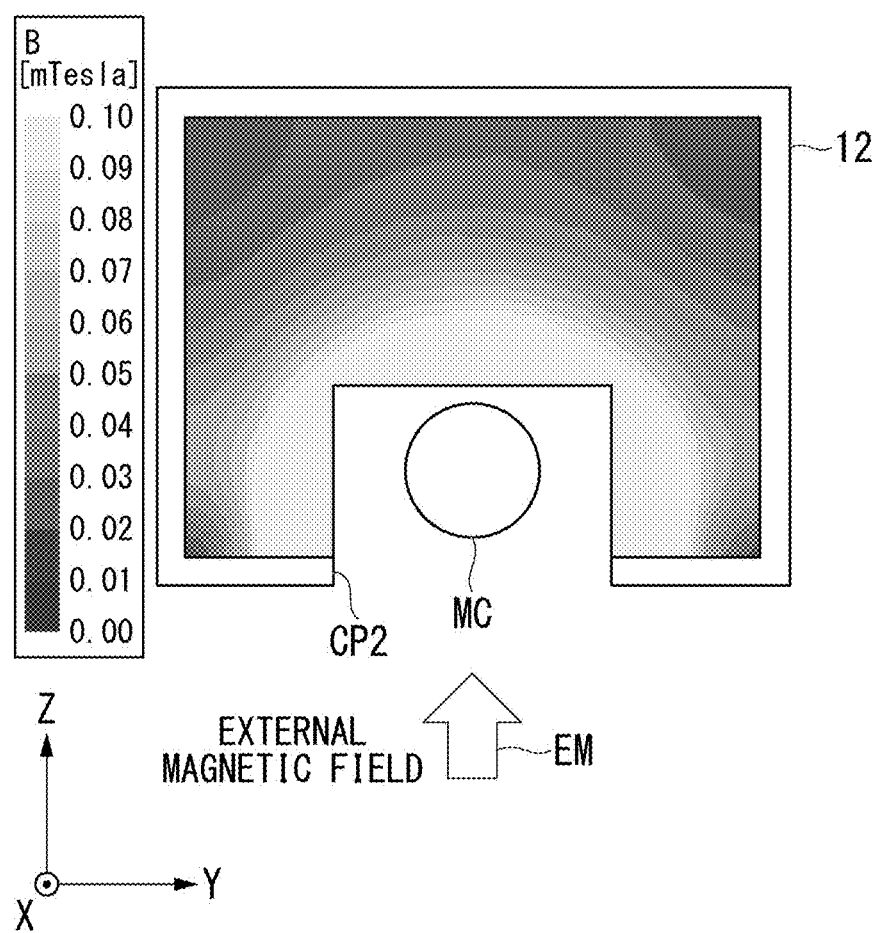
FIG. 12A is a view which shows a simulation result of a magnetic flux density distribution in the fourth embodiment of the present invention.
Figure 12B:
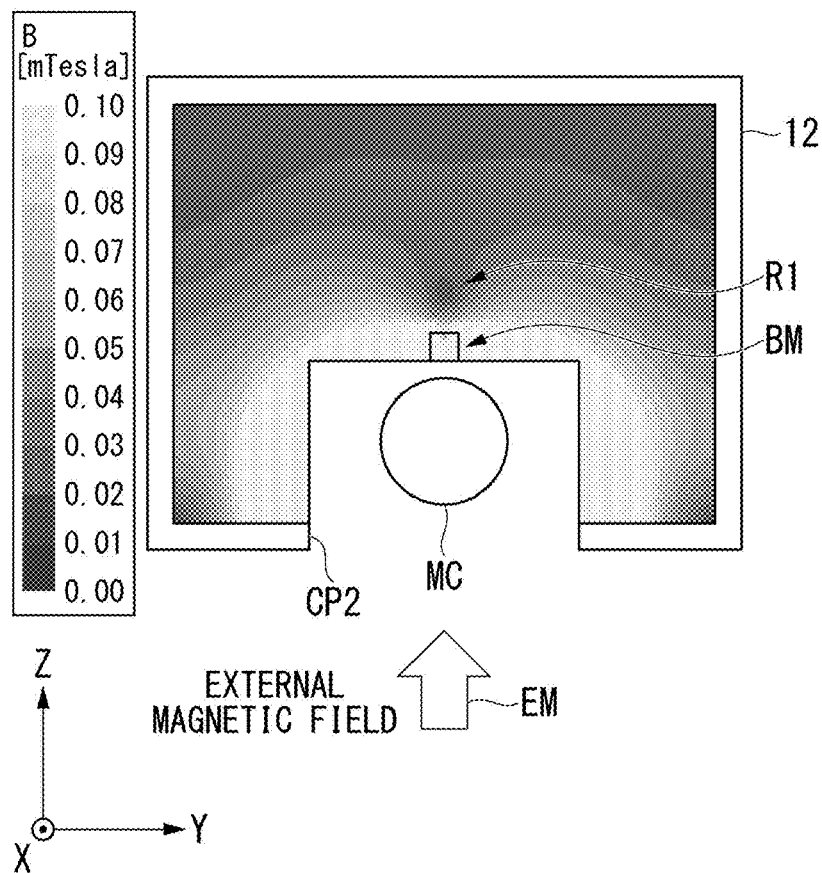
FIG. 12B is a view which shows the simulation result of the magnetic flux density distribution in the fourth embodiment of the present invention.

FIGS. 12A and 12B are views which show simulation results of magnetic flux density distribution in the fourth embodiment of the present invention. Specifically, the simulation results shown in FIG. 12 is calculated by simulating a magnetic flux density in the magnetic shield 12 when an external magnetic field EM in the Z axis direction is present. FIG. 12A shows an example in which beam member BM is not provided, and FIG. 12B shows an example in which the beam member BM is provided.

Referring to FIG. 12A, the magnetic flux density distribution in the magnetic shield 12 when no beam member BM is provided approximately has elliptical distribution in which the measurement target conductor MC is set as the center, and magnetic flux density gradually decreases as a distance from the measurement target conductor MC increases. On the other hand, referring to FIG. 12B, the magnetic flux density distribution within the magnetic shield 12 when the beam member BM is provided has a region R1 where the magnetic flux density decreases on the +Z side of the beam member BM.

Figure 13:
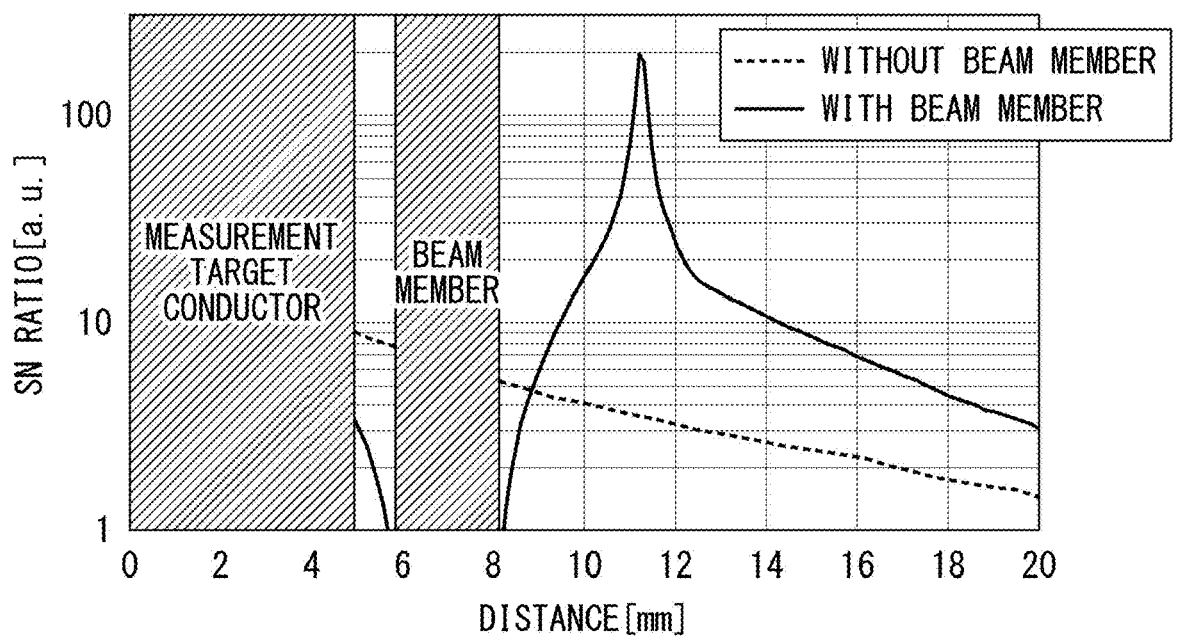
FIG. 13 is a view which shows a simulation result of an SN ratio in the fourth embodiment of the present invention.

FIG. 13 is a view which shows simulation results of the SN ratio in the fourth embodiment of the present invention. In a graph shown in FIG. 13, as in the graph shown in FIG. 4, the horizontal axis represents the distance from the center of the measurement target conductor MC in the Z direction, and the vertical axis represents the SN ratio (logarithm). As shown in FIG. 13, in the simulation, a radius of the measurement target conductor MC is set to 5 [mm], and the beam member BM with a thickness of 2 [mm] is set at a position 6 [mm] away from the center of the measurement target conductor MC.

Referring to FIG. 13, when the beam member BM is omitted, it is known that the SN ratio gradually decreases as the distance from the measurement target conductor MC (the distance from the center of the measurement target conductor MC) increases. On the other hand, when the beam member BM is provided, it is known that there is a point where the SN rises sharply and becomes 100 to 1 or more at a position where the distance from the center of the measurement target conductor MC is around 11.5 [mm]. Therefore, by disposing the magnetic sensor SE1 at this position, it is possible to improve the measurement accuracy.

Although the current measurement device according to the embodiment of the present invention has been described above, the present invention is not limited to the embodiments described above and can be freely modified within the scope of the present invention. For example, the current measurement device in the embodiments described above has the sensor head and the circuit section connected by the cable CB, but a function of the circuit section may be provided in the sensor head, and the sensor head and the circuit section may also be integrated.

In the embodiment described above, although a case in which the fixing mechanism 13 of the sensor head is a screw mechanism with a guide has been described as an example, the fixing mechanism 13 is not limited to the screw mechanism with a guide. The fixing mechanism 13 can adopt any structure as long as it can fix the measurement target conductor MC so that the distance between the center of the measurement target conductor MC and the magnetic sensor SE1 becomes the predetermined reference distance r regardless of the diameter of the measurement target conductor MC. For example, a leaf spring or the like made of resin configured to hold a side surface of the measurement target conductor MC can be employed.

Also, in the embodiments described above, an example in which the fixing mechanism 13 of the sensor head is disposed on the +X side of the magnetic shield 12 has been described. However, the fixing mechanism 13 may be disposed on the −X side of the magnetic shield 12 or may be disposed in the magnetic shield 12.

Directional terms such as "front, back, up, down, right, left, vertical, horizontal, longitudinal, lateral, rows and columns" herein in the present specification refer to these directions in the device of the present invention. Accordingly, these terms in the specification of the present invention should be interpreted relatively for the device of the present invention.

The word "configured" is used to indicate a configuration, an element, or a portion of a device that is configured or configured to perform the functions of the present invention.

Furthermore, language expressed as "means plus function" in a claim should include any structure that can be utilized to perform the functions included in the present invention.

The term "unit" is used to indicate a component, unit, piece of hardware or software programmed to perform a desired function. Hardware is typically, but not limited to, devices and circuits.

Although preferred embodiments of the present invention have been described above, the present invention is not limited to these embodiments. Configuration additions, omissions, substitutions, and other changes can be made within a range not departing from the scope of the present invention. The present invention is not limited by the description described above, but is limited only by the scope of the appended claims.

REFERENCE SIGNS LIST 1 to 3 Current measurement device
10, 10A, 10B Sensor head
12 Magnetic shield
13 Fixing mechanism
20, 20A Circuit section
21, 23 Calculator
24 Synthesizer
BM Beam member
CP2 Cutout portion
I Current
MC Measurement target conductor
r Reference distance
SE1 Magnetic sensor
SE2 Rogowski sensor
SE3 Coil

The invention claimed is:

1. A current measurement device that measures a current flowing through a measurement target conductor, the current measurement device comprising:
  a first sensor configured to detect a direct current magnetic field and a low-frequency alternating current magnetic field generated by the current flowing through the measurement target conductor;
  a magnetic shielding member that is hollow and comprises a cutout portion into which the measurement target conductor is inserted and in which the first sensor is accommodated;
  a fixing mechanism configured to fix the measurement target conductor such that a distance between a center of the measurement target conductor inserted into the cutout portion of the magnetic shielding member and the first sensor is a predetermined reference distance;
  a first calculator configured to calculate a current flowing through the measurement target conductor based on a detection result of the first sensor;
  a sensor head that comprises the first sensor, the magnetic shielding member, and the fixing mechanism; and
  a circuit section that comprises the first calculator,
  wherein the sensor head further comprises a second sensor configured to detect low-frequency to high-frequency alternating current magnetic fields generated by the current flowing through the measurement target conductor, and
  wherein the circuit section further comprises:
    a second calculator configured to calculate the current flowing through the measurement target conductor based on a detection result of the second sensor; and a synthesizer configured to synthesize a calculation result of the first calculator and a calculation result of the second calculator.

2. The current measurement device according to claim 1, wherein the second sensor comprises a Rogowski sensor wound around the measurement target conductor inserted into the cutout portion of the magnetic shielding member.

3. The current measurement device according to claim 1, wherein the second sensor comprises a coil accommodated inside the magnetic shielding member.

4. The current measurement device according to claim 3, wherein the coil is disposed inside the magnetic shielding member such that a magnetic sensing direction is a tangential direction of the measurement target conductor inserted into the cutout portion.

5. The current measurement device according to claim 1, wherein a beam member is formed between the cutout portion and the first sensor inside the magnetic shielding member.

6. The current measurement device according to claim 1, wherein the first sensor is disposed inside the magnetic shielding member such that a magnetic sensing direction of the first sensor is a tangential direction of the measurement target conductor inserted into the cutout portion.

7. The current measurement device according to claim 1, wherein a thickness of the magnetic shielding member is set so that magnetic saturation does not occur even if a maximum current that can be measured by the current measurement device flows through the measurement target conductor.

8. The current measurement device according to claim 1, further comprising:
an output section configured to output to the outside a measurement result of the current flowing through the measurement target conductor calculated by the first calculator.

9. The current measurement device according to claim 1, wherein the circuit section is separated from the sensor head and connected to the sensor head via a cable.

10. The current measurement device according to claim 1, wherein the synthesizer comprises:
a low-pass filter configured to remove high-frequency components from the calculation result of the first calculator, and configured to allow low-frequency components to pass through;
a high-pass filter configured to remove low-frequency components from the calculation result of the second calculator, and configured to allow high-frequency components to pass through;
a signal level adjuster configured to adjust a level of a signal output from the low-pass filter; and
an adder configured to add a signal whose level is adjusted by the signal level adjuster and a signal output from the high-pass filter.

11. A current measurement device that measures a current flowing through a measurement target conductor, the current measurement device comprising:
a first sensor configured to detect a direct current magnetic field and a low-frequency alternating current magnetic field generated by the current flowing through the measurement target conductor;
a magnetic shielding member that is hollow and comprises a cutout portion into which the measurement target conductor is inserted and in which the first sensor is accommodated;
a fixing mechanism configured to fix the measurement target conductor such that a distance between a center of the measurement target conductor inserted into the cutout portion of the magnetic shielding member and the first sensor is a predetermined reference distance; and
a first calculator configured to calculate a current flowing through the measurement target conductor based on a detection result of the first sensor,
wherein the first calculator is configured to calculate the current flowing through the measurement target conductor by calculating a product of a detection result of the first sensor and a constant uniquely determined based on the reference distance.

12. A current measurement device that measures a current flowing through a measurement target conductor, the current measurement device comprising:
a first sensor configured to detect a direct current magnetic field and a low-frequency alternating current magnetic field generated by the current flowing through the measurement target conductor;
a magnetic shielding member that is hollow and comprises a cutout portion into which the measurement target conductor is inserted and in which the first sensor is accommodated;
a fixing mechanism configured to fix the measurement target conductor such that a distance between a center of the measurement target conductor inserted into the cutout portion of the magnetic shielding member and the first sensor is a predetermined reference distance; and
a first calculator configured to calculate a current flowing through the measurement target conductor based on a detection result of the first sensor,
wherein a beam member is formed between the cutout portion and the first sensor inside the magnetic shielding member, and
wherein a thickness of the beam member is set to be equal to or greater than a thickness of the magnetic shielding member such that magnetic saturation does not occur even if a maximum current that can be measured by the current measurement device flows through the measurement target conductor.

* * * * *